US010210924B2

(12) United States Patent
Kamata

(10) Patent No.: US 10,210,924 B2
(45) Date of Patent: Feb. 19, 2019

(54) SEMICONDUCTOR MEMORY DEVICE

(71) Applicant: Toshiba Memory Corporation, Tokyo (JP)

(72) Inventor: Yoshihiko Kamata, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/690,256

(22) Filed: Aug. 29, 2017

(65) Prior Publication Data

US 2018/0211700 A1    Jul. 26, 2018

(30) Foreign Application Priority Data

Jan. 23, 2017    (JP) .................. 2017-009649

(51) Int. Cl.

| G11C 11/4091 | (2006.01) |
|---|---|
| G11C 11/4074 | (2006.01) |
| G11C 11/4094 | (2006.01) |
| G11C 11/4097 | (2006.01) |
| G11C 7/08 | (2006.01) |
| G11C 11/406 | (2006.01) |
| G11C 16/10 | (2006.01) |
| G11C 16/26 | (2006.01) |

(52) U.S. Cl.
CPC .......... G11C 11/4091 (2013.01); G11C 7/08 (2013.01); G11C 11/406 (2013.01); G11C 11/4074 (2013.01); G11C 11/4094 (2013.01); G11C 11/4097 (2013.01); G11C 16/10 (2013.01); G11C 16/26 (2013.01)

(58) Field of Classification Search
CPC ..... G11C 11/4091; G11C 7/08; G11C 11/406; G11C 11/4074; G11C 11/4094; G11C 11/4097
USPC ....................................... 365/208
See application file for complete search history.

(56) References Cited

U.S. PATENT DOCUMENTS

| 7,224,614 B1 | 5/2007 | Chan |
| 8,009,470 B2 | 8/2011 | Iwai et al. |
| 9,042,183 B2 | 5/2015 | Kamata et al. |
| 9,437,302 B2 | 9/2016 | Tseng et al. |
| 2014/0269094 A1* | 9/2014 | Maeda .................. G11C 16/26 365/185.21 |
| 2014/0269096 A1 | 9/2014 | Kamata et al. |
| 2016/0267971 A1 | 9/2016 | Maejima |

\* cited by examiner

*Primary Examiner* — Fernando Hidalgo
(74) *Attorney, Agent, or Firm* — Kim & Stewart LLP

(57) ABSTRACT

A semiconductor memory device includes a memory cell transistor, a bit line, a sense amplifier circuit, a voltage generation circuit, and a control unit. The bit line is electrically connected to a terminal of the memory cell transistor. The sense amplifier circuit includes a first transistor having a gate electrically connected to the bit line and a second transistor connected in series to a first terminal of the first transistor. The control unit controls the voltage generation circuit to apply a first voltage to the second terminal of the first transistor during a first sense period and a second voltage to the second terminal of the first transistor during a second sense period. The first voltage is equal to or higher than 0 V and the second voltage is higher than 0 V, and the first and second voltages have voltage levels different from each other.

20 Claims, 21 Drawing Sheets

SEMICONDUCTOR MEMORY DEVICE

This application is based upon and claims the benefit of priority from Japanese Patent Application No. 2017-009649, filed Jan. 23, 2017, the entire contents of which are incorporated herein by reference.

FIELD

Embodiments described herein relate generally to a semiconductor memory device.

BACKGROUND

A sense amplifier circuit for determining data retained in memory cells of a semiconductor memory device is known.

DETAILED DESCRIPTION

Figure 1:
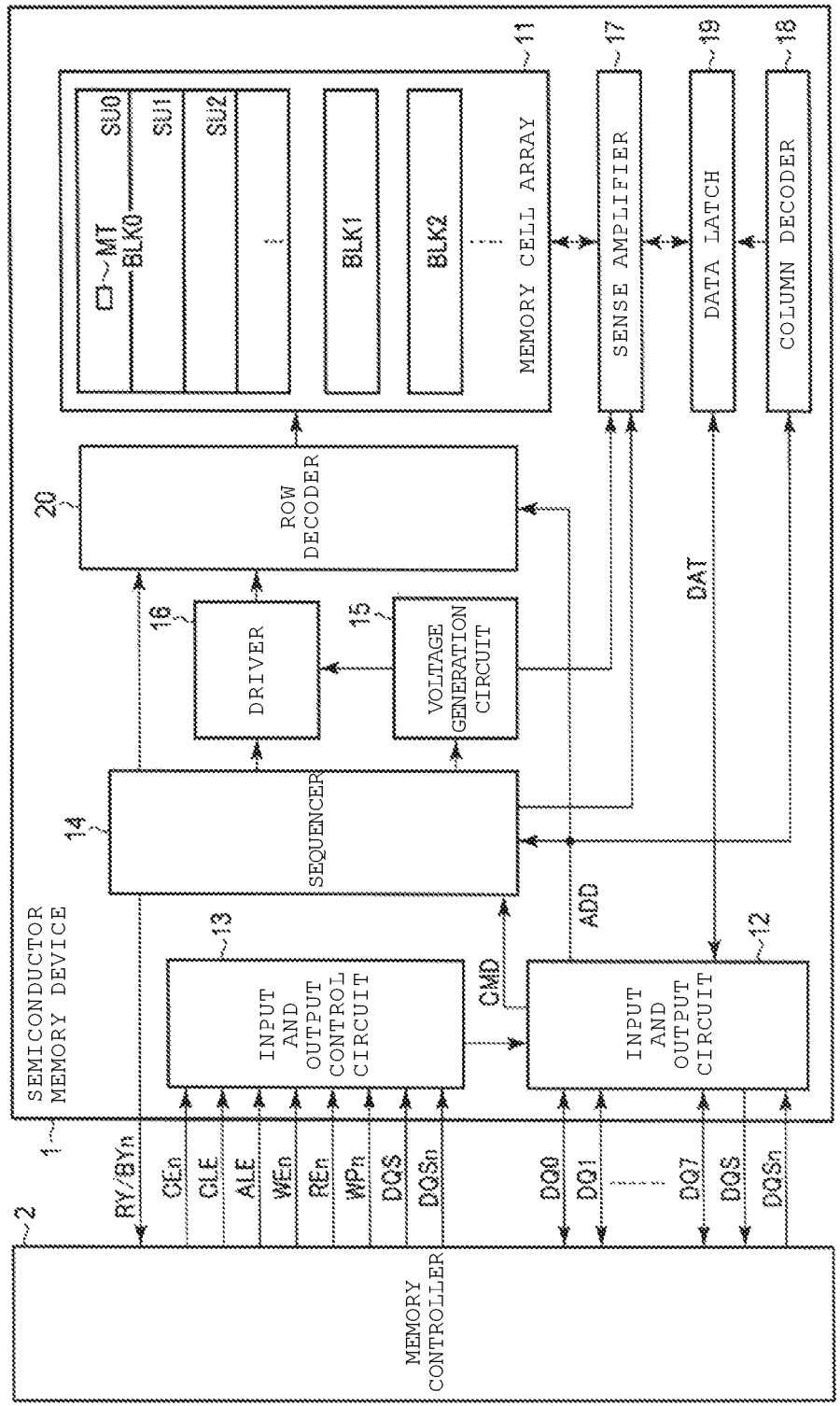
FIG. 1 is a block diagram of a semiconductor memory device according to a first embodiment.

Embodiments provide a semiconductor memory device including a sense amplifier circuit which can perform a faster operation.

In general, according to one embodiment, a semiconductor memory device includes a memory cell transistor, a bit line, a sense amplifier circuit, a voltage generation circuit, and a control unit. The bit line is electrically connected to a terminal of the memory cell transistor. The sense amplifier circuit includes a first transistor having a gate which is electrically connected to the bit line and a second transistor which is connected in series to a first terminal of the first transistor. The voltage generation circuit has an output electrically connected to a second terminal of the first transistor. The control unit is configured to control the voltage generation circuit to apply a first voltage to the second terminal of the first transistor during a first sense period and a second voltage to the second terminal of the first transistor during a second sense period following the first sense period. The first voltage is equal to or higher than 0 V and the second voltage is higher than 0 V, and the first and second voltage have voltage levels different from each other.

In the following, embodiments will be described with reference to the drawings. In the following description, the same symbols or reference numerals are attached to elements having approximately the same function and configuration, and repetitive description is omitted. The description of a certain embodiment may also apply to another embodiment, so long as the description is not excluded explicitly or the exclusion is obvious.

In the embodiments, each functional block can be realized by one of hardware or software of a computer, or by combining both.

In the present specification and the scope of claims, "connecting" a first element to a second element includes directly, or connecting the first element to the second element through a conductive element.

First Embodiment 1-1. Configuration (Structure)

FIG. 1 illustrates functional blocks of a semiconductor memory device 1 according to a first embodiment. As illustrated in FIG. 1, the semiconductor memory device 1 incudes elements, such as a memory cell array 11, an input and output circuit 12, an input and output control circuit 13, a sequencer (which is a control circuit in the embodiment) 14, a voltage generation circuit 15, a driver 16, a sense amplifier 17, a column decoder 18, a data latch 19, and a row decoder 20.

The cell array 11 includes a plurality of blocks (memory block) BLK (BLK0, BLK1, . . . ). Data of each block BLK is collectively erased in one embodiment. In other embodiments, the data maybe erased in a unit (for example, half of the block BLK) smaller than one block BLK. The block BLK includes a plurality of memory cell transistors MT.

The input and output circuit 12 accepts signals DQ (DQ0 to DQ7), and transmits the signals DQ. The input and output circuit 12 also transmits and accepts data strobe signals DQS and DQSn. The signal with a name having "n" at the end is a signal with an inverted logic with respect to a signal with a name without "n".

The input and output control circuit 13 accepts various control signals from a memory controller 2, and controls the input and output circuit 12 on the basis of the control signals. The control signals include signals CEn, CLE, ALE, WEn, REn, and WPn, and a data strobe signals DQS and DQSn.

The sequencer 14 accepts a command signal CMD and an address signal ADD from the input and output circuit 12, and controls the voltage generation circuit 15, the driver 16, the sense amplifier 17, and the column decoder 18, based on the command signal CMD and the address signal ADD.

The voltage generation circuit 15 receives a power supply potential from the outside of the semiconductor memory device 1, and generates various voltages from the power supply potential. The generated voltage is supplied to elements such as the driver 16 and the sense amplifier 17. The driver 16 receives voltages generated by the voltage generation circuit 15, and supplies voltages selected from among the accepted voltages to the row decoder 20.

The row decoder 20 receives various voltages from the driver 16, receives the address signal ADD from the input and output circuit 12, selects one block BLK on the basis of the accepted address signal ADD, and transmits the voltage from the driver 16 to the selected block BLK.

The sense amplifier 17 senses states of cell transistors MT, generates read data DAT on the basis of the sensed state, and transmits write data DAT to the cell transistors MT. In addition, the sense amplifier 17 receives various voltages from the voltage generation circuit 15, and controls voltages of bit lines.

The data latch 19 retains the write data DAT from the input and output circuit 12, and supplies the write data DAT to the sense amplifier 17. In addition, the data latch 19 accepts the read data DAT from the sense amplifier 17, and supplies the read data DAT to the input and output circuit 12 under control of the column decoder 18. The column decoder 18 controls the data latch 19 on the basis of the address signal ADD.

1-1-1. Block

Figure 2:
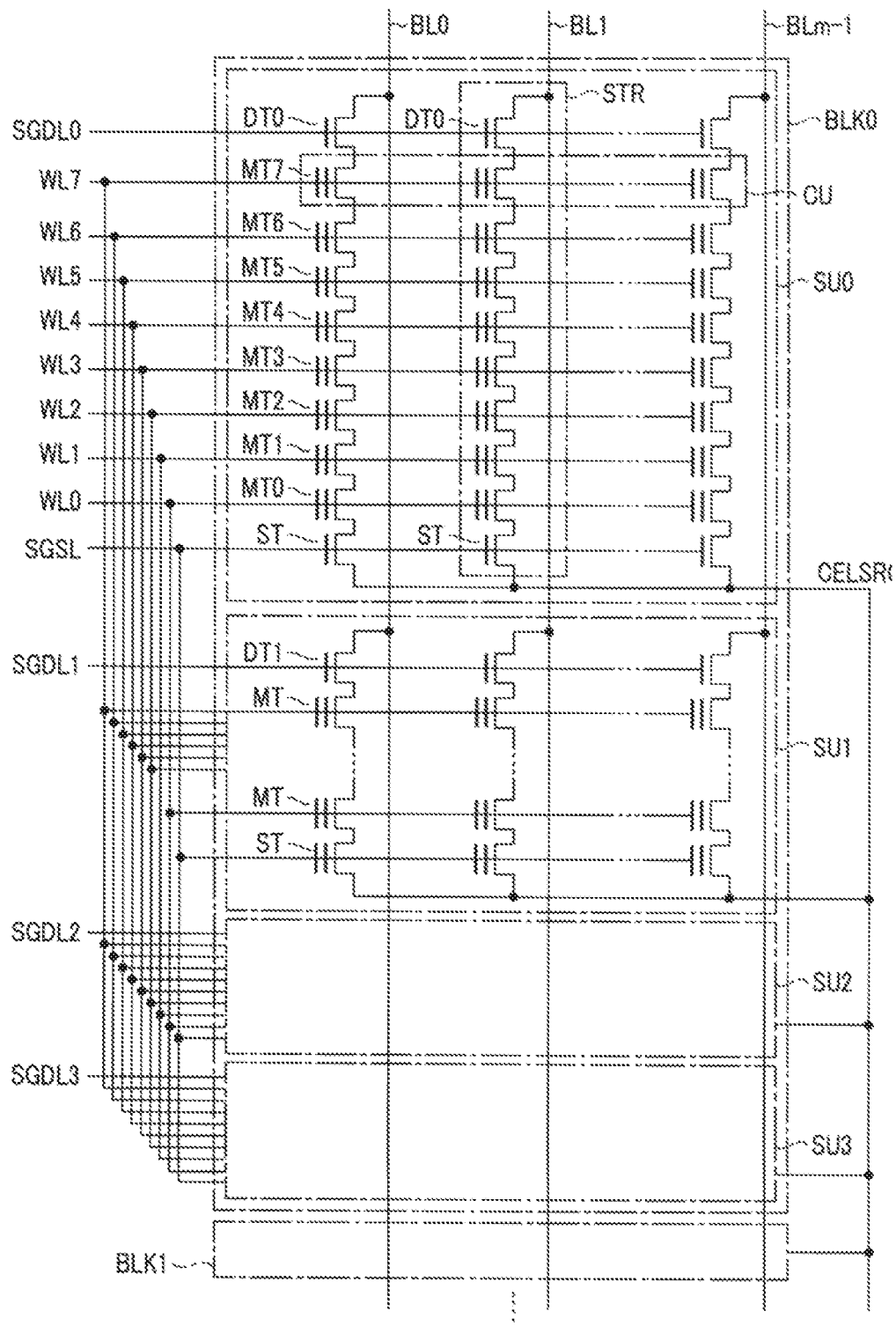
FIG. 2 is a circuit diagram of one block according to the first embodiment.

FIG. 2 illustrates an example of partial elements and partial connections of the cell array 11, and illustrates elements and connections of one block BLK0 and elements relating thereto. Each block in a plurality of (for example, all of) the blocks BLK includes all of the elements and connections illustrated in FIG. 2.

One block BLK includes a plurality of string units SU0 to SU3. Alternatively, one block BLK may include only one string unit SU.

Each of m (m is a natural number) bit lines BL0 to BLm-1 is connected to one string STR from each of the string units SU0 to SU3 in each block BLK.

Each string STR includes one selection gate transistor ST, a plurality of (for example, eight) memory cells transistors MT, and one selection gate transistor DT (DT0 to DT3). The transistors ST, MT, and DT are connected in series in this order between a source line CELSRC and one bit line BL.

The cell transistor MT includes a control gate electrode and a charge storage layer insulated from a periphery thereof, and can retain data in a nonvolatile manner on the basis of charges of the charge storage layer.

A plurality of strings STR respectively connected to a plurality of different bit lines BL forms one string unit SU. In each string unit SU, control gate electrodes (also referred to herein as simply "gates") of the cell transistors MT0 to MT7 are respectively connected to word lines WL0 to WL7. Furthermore, in each block BLK, word lines WL having the same address in the different string units SU are also connected to each other. A set of cell transistors MT which shares the word line WL in one string unit SU is referred to as a cell unit CU.

Transistors DT0 to DT3 are respectively included in the string units SU0 to SU3. In a case of each of α=0 to 3, gates of each transistor DTα of a plurality of strings STR of the string unit SUα are connected to a selection gate line SGDLα. Gates of the transistors ST are connected to a selection gate line SGSL.

Figure 3:
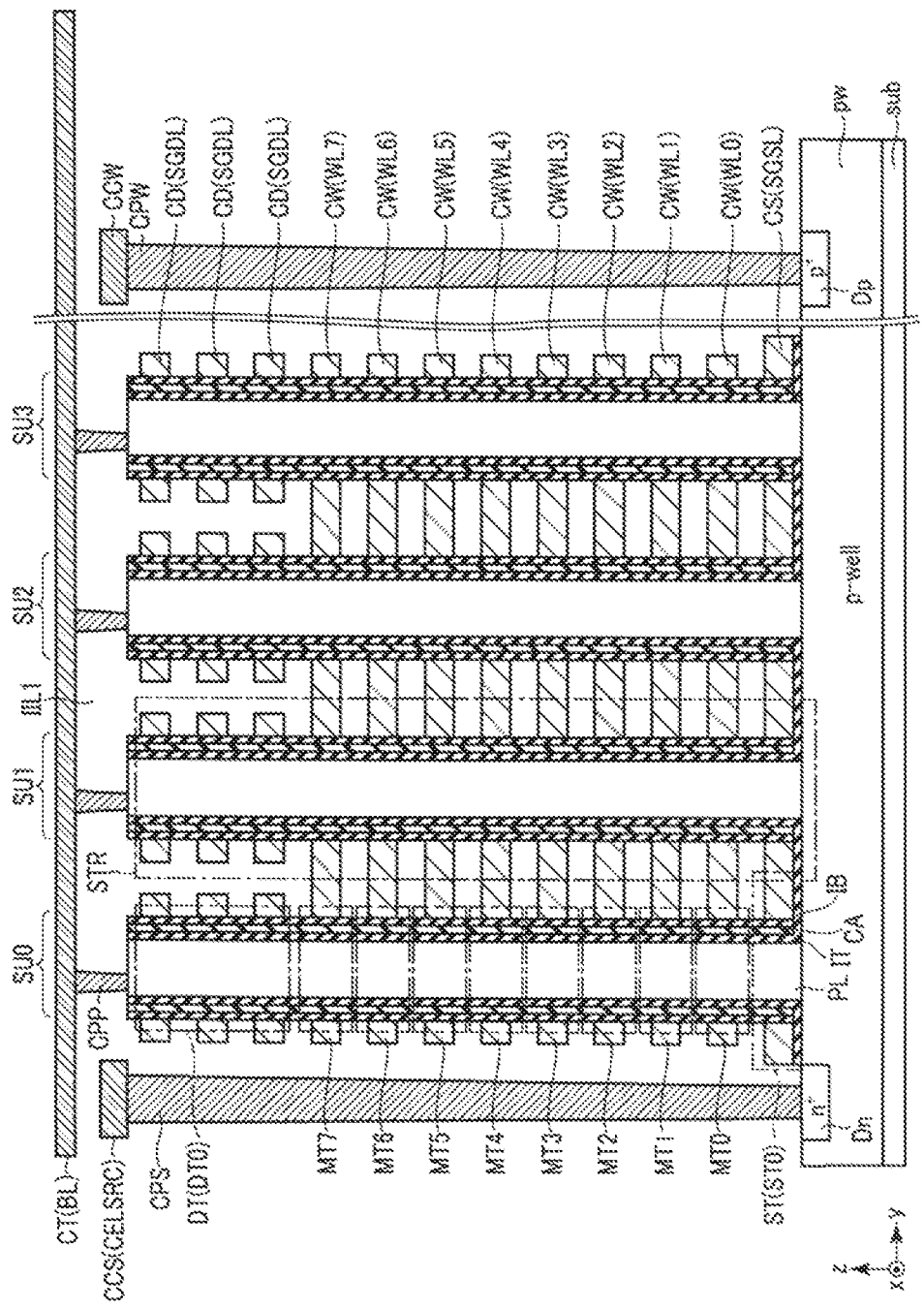
FIG. 3 illustrates a cross section of an example of a structure of the block according to the first embodiment.

Each block BLK has a structure illustrated in FIG. 3. As illustrated in FIG. 3, the string units SU are provided on a substrate sub. The substrate sub spreads along the xy plane and includes a p-type well pw. Each string unit SU includes a plurality of strings STR which is arranged along the x-axis. Each string STR includes a semiconductor pillar PL. The pillar PL extends along the z-axis, is in contact with the well pw at a lower end, and functions as channel regions of the transistors MT, DT, and ST. An upper end of the pillar PL is in contact with a conductor CT through a conductive plug CPP. The conductor CT extends along the y-axis and functions as one bit line BL, and there is a gap between the conductor CT and another conductor CT located at another position along the x-axis. Aside surface of the pillar PL is covered with a tunnel insulator IT. The tunnel insulator IT is also located on the well pw. Aside surface of the tunnel insulator IT is covered with a charge storage layer CA. The charge storage layer CA has insulating properties (or alternatively, conductive properties), and a side surface thereof is covered with a block insulator IB.

One conductor CS, a plurality of (for example, eight) conductors CW, and a plurality of (for example, three) conductors CD are provided above the well pw in each string unit SU. Alternatively, a plurality of conductors CS may be provided. There are gaps between the conductors CS, CW, and CD, and the conductors CS, CW, and CD are arranged along the z-axis, extend along the x-axis, and are in contact with the block insulator IB. In addition, the tunnel insulator IT is interposed between the conductor CS and an upper surface of the well pw. The conductors CS, CW, and CD respectively function as the selection gate line SGSL, word lines WL0 to WL7, and the selection gate line SGDL. In each string unit SU, The conductors CS, CW, and CD are internally in contact with the block insulator IB on the side surface of the entire semiconductor pillar PL in the string units SU.

Portions crossing the conductors CS, CW, and CD in the pillar PL, the tunnel insulator IT, the charge storage layer CA, and the block insulator IB respectively form the selection gate transistor ST, the cell transistors MT, and the selection gate transistor DT. The transistors ST, MT, and DT, which share one pillar PL and are arranged along the z-axis, form one string STR.

A diffusion layer Dp of $p^+$-type impurity is provided in a region of the well pw. The diffusion layer Dp is in contact with a conductor CCW through a conductive plug CPW. The plug CPW spreads along the xz plane.

A diffusion layer Dn of n$^+$-type impurity is provided in a region of the well pw. The diffusion layer Dn is in contact with a conductor CCS through a conductive plug CPS. The conductor CCW functions as a source line CELSRC.

An insulator IIL1 is provided in a region above the substrate sub where the conductors CS, CW, CD, CCS, and CCW and the plug CPS and CPW are not provided.

1-1-2. Cell Transistor

Figure 4:
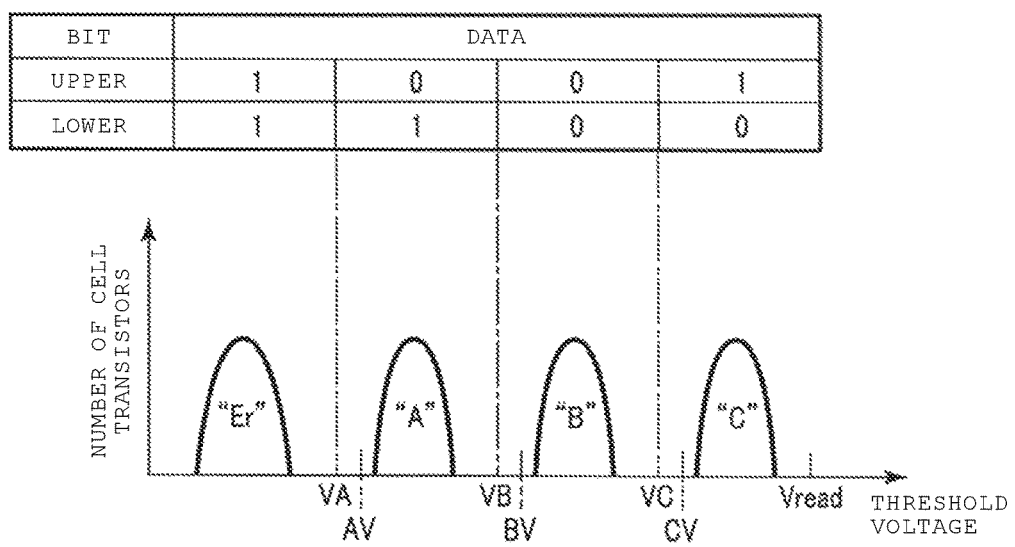
FIG. 4 illustrates an example of data which is retained in the semiconductor memory device according to the first embodiment.

The semiconductor memory device 1 can retain data of one bit or more in one cell transistor MT. FIG. 4 illustrates distribution of threshold voltages of the cell transistors MT which retains data of two bits per cell transistor as result of writing. The threshold voltages of each cell transistor MT have magnitudes according to the data which is retained. In a case where data of two bits per cell transistor is retained, each cell transistor MT can have any one of four threshold voltages.

The plurality of cell transistors MT which retains certain data of the same two bits can also have threshold voltages different from each other, and thus, the threshold voltages of the plurality of cell transistors MT which retains the same data form one distribution. The cell transistors MT may belong to one of four distributions—an Er level, an A level, a B level, and a C level. The Er level, the A level, the B level, and the C level are treated as states where, for example, "11" data, "01" data, "00" data, and "10" data are respectively retained. Alternatively, a different correspondence between the state and the data which is retained may be used.

The threshold voltages of the cell transistors having the A level, the B level, and the C level are higher than the threshold voltages of the cell transistors having the Er level, the A level, and the B level. The cell transistor MT having the threshold voltage lower than a read voltage VA is determined to be in the Er level. The cell transistor MT having the threshold voltage higher than or equal to the read voltage VA and lower than a read voltage VB is determined to be in the A level. The cell transistor MT having the threshold voltage higher than or equal to the read voltage VB and lower than a read voltage VC is determined to be in the B level. The cell transistor MT having the threshold voltage higher than or equal to the read voltage VC is determined to be in the C level. Each of the cell transistors MT having the threshold voltages higher than or equal to the read voltages VA, VB, and VC is maintained to be turned off, although control gate electrodes thereof are applied the read voltages VA, VB, and VC. Meanwhile, each of the cell transistors MT having threshold voltages lower than the read voltages VA, VB, and VC is turned on, if the control gate electrodes thereof are applied the read voltages VA, VB, and VC. The voltage Vread is higher than the threshold voltage of any of the cell transistors MT.

In a case where one cell transistor MT retains data of a plurality of bits, a set of data of bits in the same location of the cell transistors MT in one cell unit CU forms one page. In a case where one cell transistor MT retains data of two bits, a set of data of higher bits of the cell transistors MT in one cell unit CU forms an upper page. A set of data of lower bits of the cell transistors MT in one cell unit CU forms a lower page.

Verification voltages AV, BV, and CV are used for verifying writing data in the A level, the B level, and the C level. If the selected cell transistors MT to which data is written in the A level, the B level, and the C level respectively have threshold voltages with magnitudes higher than or equal to the verification voltages AV, BV, and CV, it is determined that programming of the cell transistor MT which is programmed to the related level is completed. The verification voltages BV and CV are higher than the verification voltages AV and BV, respectively.

By extending the principle described so far, data of three bits or more can be retained in one cell transistor MT.

1-1-3. Sense Amplifier and Data Latch

Figure 5:
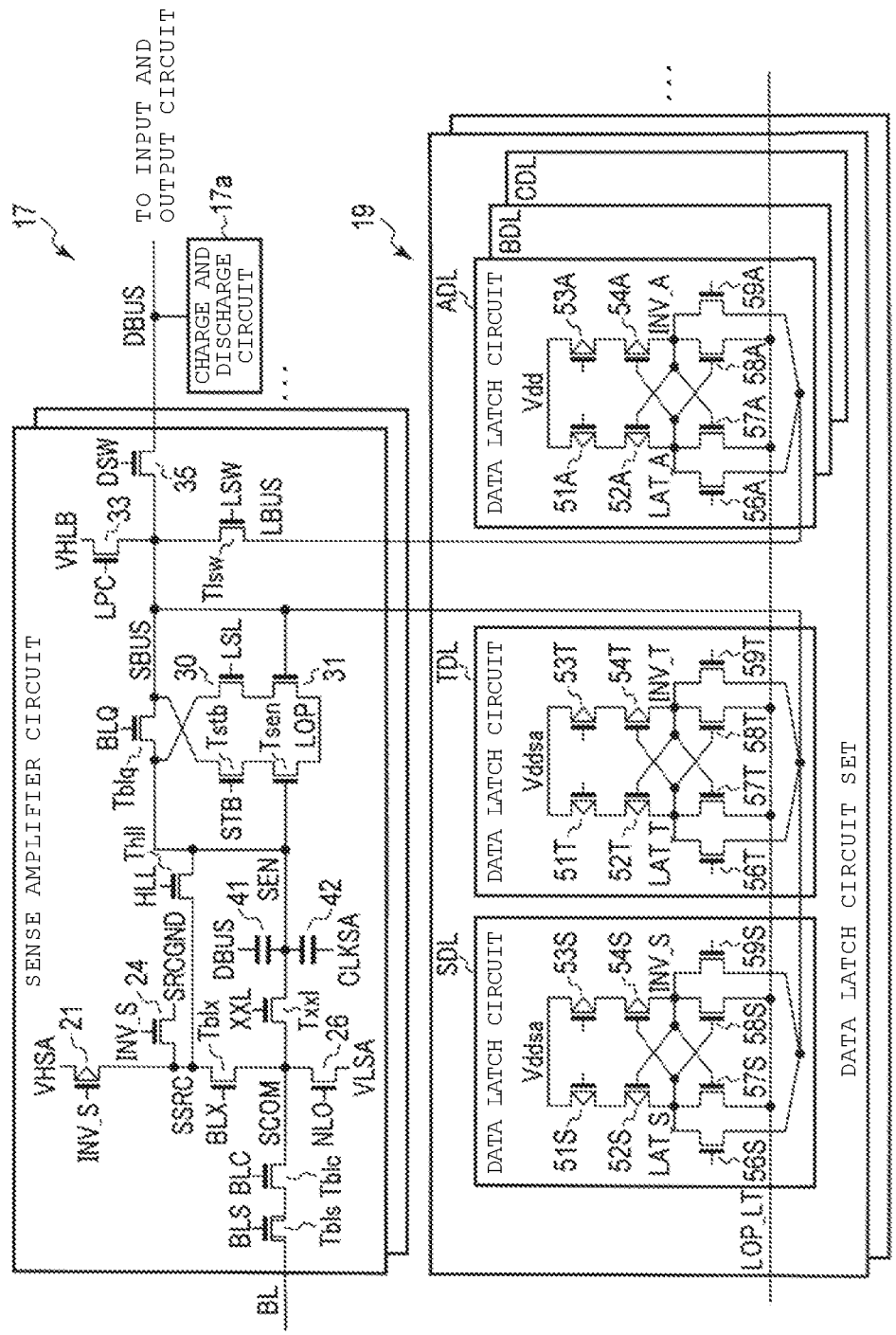
FIG. 5 illustrates a part of elements and connections of a sense amplifier and a data latch according to the first embodiment.

FIG. 5 illustrates a part of the elements and the connections of the sense amplifier 17 and the data latch 19. The sense amplifier 17 includes a plurality of sense amplifier circuits SAC and a charge and discharge circuit 17a. All the sense amplifier circuits SAC have the same elements and connections. One sense amplifier circuit SAC is connected to one bit line BL. The data latch 19 includes a plurality of data latch circuit sets. One data latch circuit set includes data latch circuits SDL, TDL, ADL, BDL, and CDL, and is connected to one sense amplifier circuit SAC. All the data latch circuit sets have the same elements and connections.

As illustrated in FIG. 5, each sense amplifier circuit SAC includes a p-type metal oxide semiconductor field effect transistor (MOSFET) 21, n-type MOSFETs Tbls, Tblc, 24, Tblx, 26, Thll, Txxl, Tstb, Tsen, 30, 31, Tblq, 33, Tlsw, and 35, and capacitors 41 and 42.

One bit line BL is connected to a node SCOM through transistors Tbls and Tblc which are connected in series. Gates of the transistors Tbls and Tblc respectively accept, for example, signals BLS and BLC from the sequencer 14. The node SCOM is connected to a node of a voltage VHSA through the transistors Tblx and 21 which are connected in series. A gate of the transistor 21 is connected to a node INV_S, and a gate of the transistor Tblx accepts, for example, a signal BLX from the sequencer 14.

A node SSRC which connects the transistor 21 to the transistor Tblx is connected to a node SRCGND through the transistor 24. A gate of the transistor 24 is connected to the node INV_S. In addition, the node SSRC is connected to a node SEN through the transistor Thll. The transistor Thll receives, for example, a signal HLL from the sequencer 14.

In addition, the node SCOM is connected to a node of a voltage VLSA through the transistor 26. A gate of the transistor 26 accepts, for example, a signal NLO from the sequencer 14.

The node SCOM is further connected to a node SEN through the transistor Txxl. A gate of the transistor Txxl accepts, for example, a signal XXL from the sequencer 14. The node SEN accepts a signal CLKSA through the capacitor 42. The signal CLKSA is controlled by, for example, the sequencer 14. In addition, the node SEN is capacitively coupled with a bus DBUS which will be described below, by the capacitor 41.

In addition, the node SEN is connected to a bus SBUS through the transistor Tblq. A gate of the transistor Tblq accepts, for example, a signal BLQ from the sequencer 14. The node SEN is further connected to a node LOP through the transistors 30 and 31 which are connected in series. Alternatively, a node of the transistor 31 which is opposite to the transistor 30 may be grounded without being connected to the node LOP. A gate of the transistor 30 accepts, for example, a signal LSL from the sequencer 14.

Figure 6:
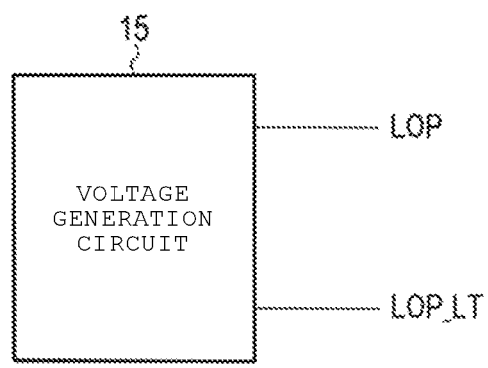
FIG. 6 illustrates connections between a voltage generation circuit according to the first embodiment and two nodes.

A voltage of the node LOP is controlled the voltage generation circuit 15 as illustrated in FIG. 6.

Description will be made again with reference to FIG. 5. In addition, the bus SBUS is connected to the node LOP through the transistors Tstb and Tsen which are connected in series. A gate of the transistor Tstb accepts, for example, a signal STB from the sequencer 14. A gate of the transistor Tsen is connected to the node SEN.

In addition, the bus SBUS is connected to a node of a voltage VHLB through the transistor 33. A gate of the transistor 33 accepts, for example, a signal LPC from the sequencer 14.

The bus SBUS is further connected to the bus DBUS through the transistor 35. The bus DBUS is connected to the input and output circuit 12. A voltage of the bus DBUS can be adjusted by the charge and discharge circuit 17a. The charge and discharge circuit 17a is controlled by, for example, the sequencer 14. A gate of the transistor 35 accepts, for example, a signal DSW from the sequencer 14.

The bus DBUS is further connected to a bus LBUS through the transistor Tlsw. A gate of the transistor Tlsw accepts, for example, a signal LSW from the sequencer 14.

In a case of each of β=S and T, a data latch circuit βDL includes p-type MOSFETs 51β, 52β, 53β, and 54β and n-type MOSFETs 56β, 57β, 58β, and 59β.

A set of the transistors 52β, 54β, 57β, and 58β forms two cross-connected inverter circuits. That is, the transistors 51β, 52β, and 57β are connected in series between a node of a voltage Vddsa and a node LOP_LT in that order. In addition, the transistors 53β, 54β, and 58β are connected in series between the node of the voltage Vddsa and the node LOP_LT in that order. In addition, a node LAT_β which connects the transistor 52β to the transistor 57β is connected to gates of each of the transistors 54β and 58β, and a node INV_β which connects the transistor 54β to the transistor 58β is connected to gates of each of the transistors 52β and 57β. The node LAT_β has the voltage Vddsa or a voltage Vloplt of the node LOP_LT on the basis of data of one bit which is retained in the latch circuit βDL. The node INV_β has a voltage opposite to the voltage of the node LAT_β among the voltage Vddsa and the voltage Vloplt.

A voltage of the node LOP_LT is controlled by the voltage generation circuit 15 as illustrated in FIG. 6.

Description will be made again with reference to FIG. 5. In addition, the node LAT_β is connected to the bus SBUS through the transistor 56β. The node INV_β is connected to the bus SBUS through the transistor 59β.

In a case of each of γ=A, B, and C, a data latch circuit γDL includes p-type MOSFETs 51γ, 52γ, 53γ, and 54γ and n-type MOSFETs 56γ, 57γ, 58γ, and 59γ.

A set of the transistors 52γ, 54γ, 57γ, and 58γ configures two cross-connected inverter circuits. That is, the transistors 51γ, 52γ, and 57γ are connected in series between a node of a voltage Vdd and the node LOP_LT in that order. In addition, the transistors 53γ, 54γ, and 58γ are connected in series between the node of the voltage Vdd and the node LOP_LT in that order. In addition, a node LAT_γ which connects the transistor 52γ to the transistor 57γ is connected to gates of each of the transistors 54γ and 58γ, and a node INV_γ which connects the transistor 54γ to the transistor 58γ is connected to gates of each of the transistors 52γ and 57γ. The node LAT_γ has the voltage Vddsa or the voltage Vloplt of the node LOP_LT on the basis of data of one bit which is retained in the latch circuit γDL. The node INV_γ has a voltage opposite to the voltage of the node LAT_γ among the voltage Vddsa and the voltage Vloplt. Although the node of the voltage Vdd is independent of the node of the voltage Vddsa, the node of the voltage Vdd has the same voltage.

The node LAT_γ is connected to the bus SBUS through the transistor 56γ. The node INV_γ is connected to the bus SBUS through the transistor 59γ.

1-2. Operation

An operation of the semiconductor memory device 1 will be described with reference to FIGS. 7 to 11. Particularly, verification for a certain level being written will be described. For example, writing includes that data of the entire page which is provided by the designated one cell unit (referred to herein as a selected cell unit) CU is collectively written to the cell transistor (referred to herein as a selected cell transistor) MT of the selected cell unit CU. Such collective writing includes a plurality of program loops. Each program loop includes a program and verification.

The program includes increasing the threshold voltages of the several selected cell transistors MT, and includes applying a program voltage Vpgm of a certain magnitude to a selected cell unit CU and a selected word line WL. The program voltage Vpgm increases by an increase amount ΔVpgm of a certain magnitude every software program loop. In the following description, a voltage of a certain magnitude which is applied to the selected word line WL between programs in a certain program loop is referred to as a program voltage Vpgm. That is, the program voltages Vpgm have different magnitudes in different program loops.

Verification indicates confirmation on whether or not each selected cell transistor MT increasing a threshold voltage thereof exceeds one target level on the basis of data which is written, among the verification voltages AV, BV, and CV.

Figure 7:
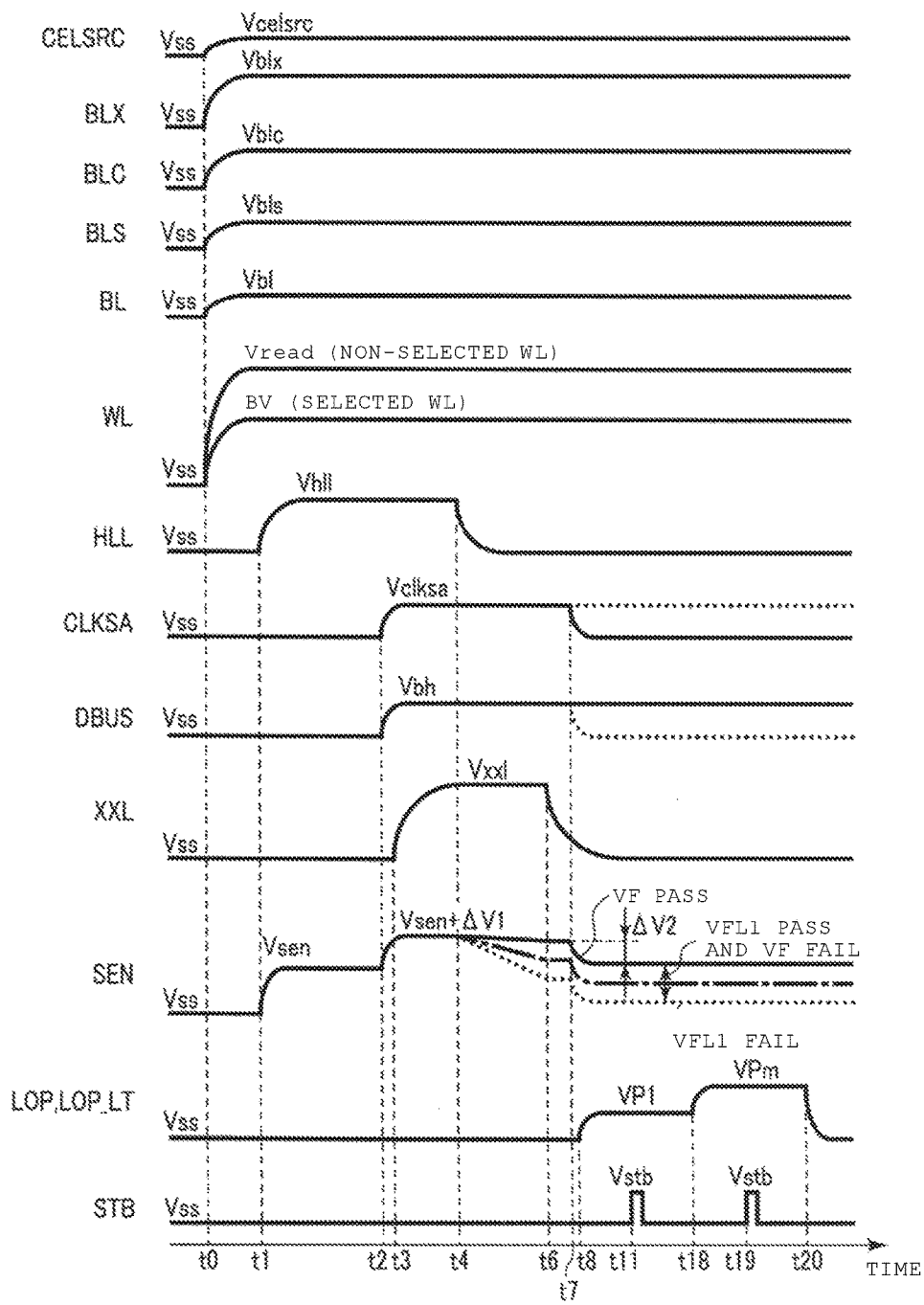
FIG. 7 is a timing diagram of voltages of several wires during verification of the semiconductor memory device according to the first embodiment.

As an example, FIG. 7 and the following description relate to verification for the selected cell transistor MT having the B level as a target level. Verification for the selected cell transistor MT having levels other than the B level as a target level is also the same as the verification for the B level which will be described hereinafter, except for a voltage which is applied to the word line WL which will be described below.

FIG. 7 illustrates a part of operations of the sense amplifier circuit SAC of the semiconductor memory device 1 according to the first embodiment, and is a timing diagram of voltages which are applied to several wires during verification for a certain program loop (referred to herein as the $x^{th}$ program loop). Since it is verification of the B level, writing of the B level is incomplete. That is, during the verification, the selected cell transistor CU includes both the selected cell transistor MT which is selected in the B level and the selected cell transistor MT which is not written in the B level.

During verification, the sequencer 14 continuously applies a voltage Vsgd to the selection gate line SGDL of the selected string unit SU including the selected cell unit CU (not illustrated). The voltage Vsgd has a magnitude for turning on the selection gate transistor DT. Meanwhile, the sequencer 14 continuously applies Vss (for example, 0 V) to the selection gate line SGDL of the non-selected string unit SU. In addition, the sequencer 14 also continuously applies Vss to the selection gate line SGSL. In addition, during verification, the transistor 21 of the sense amplifier circuit SAC connected to the selected cell transistor MT which is a verification target is turned on.

The sequencer 14 continuously applies a voltage Vcelsrc to a source line CELSRC from time t0 until the verification is completed. The voltage Vcelsrc is higher than the voltage Vss. In addition, the sequencer 14 sets voltages of the signals BLX, BLC, and BLS to voltages Vblx, Vblc, and Vbls respectively from time T0 until verification is completed. The voltages Vblx, Vblc, and Vbls are higher than the voltage Vss, and respectively have magnitudes for allowing the transistors Tblx, Tblc, and Tbls to transfer voltages. As the voltages are transferred through the transistors Tblx, Tblc, Tbls are transferred, the bit line BL is charged with the voltage Vbl.

In addition, the sequencer 14 applies the verification voltage BV for the B level to the selected word line WL from the time t0 until verification is completed. Although accepting the verification voltage BV, the selected cell transistor MT having a threshold voltage higher than or equal to the verification voltage BV is maintained to be turned off. That is, in the selected cell transistor MT, a channel is not formed and a current does not flow between a source region and a drain region except for an inevitable leakage current.

Meanwhile, if accepting the verification voltage BV, the selected cell transistor MT having a threshold voltage lower than the verification voltage BV is turned on. That is, in the selected cell transistor MT, a channel is formed and a cell current flows. A magnitude of the cell current depends on how much the selected cell transistor MT is turned on. The more cell current flows through the selected cell transistor MT having the threshold voltage lower than the verification voltage BV. However, the cell current, that is, a current Ids flowing between the source region and the drain region has an upper limit based on characteristics of the cell transistor MT. All the cell transistors MT having threshold voltages lower than the verification voltage BV by a voltage higher than a certain magnitude are sufficiently turned on, and a certain saturated source-drain current Idss flow therethrough. Meanwhile, the cell transistor MT which is weakly turned on without being sufficiently turned on operates at an analog region and the source-drain current Ids smaller than the current Idss flows therethrough.

Furthermore, the sequencer 14 applies a voltage Vread to the non-selected word lines WL from the time t0 until verification is completed.

From time t1, the sequencer 14 sets a voltage of the signal HLL to a voltage Vhll. The voltage Vhll is higher than Vss, and has a magnitude for allowing the transistor Thll to transfer a voltage to be transferred. The node SEN is charged with a voltage Vsen as the transistor Thll transfers the voltage. The voltage Vsen is higher than the voltage Vss.

From time t2, the sequencer 14 increases a voltage of a node CLKSA up to a voltage Vclksa and precharges the bus DBUS with a voltage Vbh by controlling the charge and discharge circuit 17a. The node CLKSA is capacitively coupled with the node SEN and the bus DBUS, and thus, as voltages of the node CLKSA and the bus DBUS increase, a voltage of the node SEN increases. Increase of the voltage of the node SEN according to the increase of the voltage of the nodes (for example, the node CLKSA and the bus DBUS) capacitively coupled with the node SEN is referred to as clock-up. By the clock-up, the voltage of the node SEN increases to Vsen+$\Delta$V1 from the time t2. The voltage $\Delta$V1 depends on the voltage Vclksa, the voltage Vbh, and capacitive coupling of the node SEN and the node CLKSA with the bus DBUS. The transistor Tsen is turned on by the voltage Vsen of the node SEN+$\Delta$V1.

From time t3, the sequencer 14 sets a voltage of a signal XXL to a voltage Vxxl. The voltage Vxxl has a magnitude for allowing the transistor Txxl to transfer a voltage. Hence, the node SEN is connected to a corresponding bit line BL through a node SCOM.

From time t4, the sequencer 14 returns the voltage of the signal HLL to the voltage Vss. As a result, charging the node SEN through the transistor Thll stops, and the voltage of the node SEN is affected by a voltage of the bit line BL which is connected thereto.

From time t4, the voltage of the node SEN decreases by a magnitude depending on the threshold voltage of the selected cell transistor MT connected to the node SEN. Hence, in a case where the node SEN is connected to the selected cell transistor MT which is turned off, the voltage (denoted by a solid line) of the node SEN hardly decreases. In a case where the node SEN is connected to the selected cell transistor MT which is sufficiently turned on, the voltage (denoted by a dashed line) of the node SEN significantly decreases. Even in a case where the node SEN is connected to the selected cell transistor MT which is weakly turned on, the voltage of the node SEN decreases. A representative voltage of the node SEN connected to the selected cell transistor MT which is weakly turned on is denoted by one-dot chain line. The voltage of the node SEN can have various magnitudes between a minimum magnitude (dashed line) and a maximum magnitude (solid line), and, in other words, has an analog value.

At time t6, the sequencer 14 returns a voltage of the signal XXL to the voltage Vss. As a result, the transistor Txxl is turned off, the node SEN electrically floats, and the voltage of the node SEN is stored in the node SEN at time t6.

At time t7, the sequencer 14 returns the voltage of the node CLKSA to the voltage Vss. Meanwhile, the voltage of the bus DBUS is maintained also from the time t7. As the voltage of the node CLKSA decreases, the voltage of the node SEN decreases. Decrease of the voltage of the node SEN due to the decrease of the node (for example, node CLKSA) which is capacitively coupled with the node SEN, is referred to as clock-down. By the clock-down, the voltage of the node SEN decreases by a voltage $\Delta$V2 from the time t7. The voltage $\Delta$V2 is lower than the voltage $\Delta$V1.

The amount of decrease of the voltage of the node SEN due to the clock-down is controlled by the voltage of the node CLKSA and the voltage of the bus DBUS. For example, in addition to the decrease of the voltage of the node CLKSA, the voltage of the bus DBUS can also decrease as denoted by a dashed line. In addition, the voltage of the node CLKSA is maintained as denoted by a dashed line, and the voltage of the bus DBUS can decrease as denoted by a dashed line.

From time t8, the sequencer 14 biases voltages of the nodes LOP and LOP_LT to a voltage VP1. The voltage VP1 has a magnitude for allowing the transistor Tsen connected to the node SEN connected to the cell transistor MT having a threshold voltage of a magnitude less than a verification voltage BVL1 lower than the verification voltage BV for the B level which is a current verification target to be turned off, and for allowing the transistor Tsen connected to the node SEN connected to the cell transistor MT having a threshold voltage of a magnitude higher than or equal to the verification voltage BVL1, to be turned on. That is, as the node LOP has the voltage VP1, a gate-source voltage Vgs of the transistor Tsen is lower than a case where the node LOP has the voltage Vss. Accordingly, in a case where the node LOP is biased to the voltage VP1, the transistor Tsen is difficult to be turned compared with a case where the node is not biased, when the same voltage is applied to a gate thereof. That is, in a case where the node LOP is biased to the voltage VP1, if a value which is obtained by subtracting the voltage VP1 from the voltage of the node SEN is not higher than or equal to the threshold voltage of the transistor Tsen, the transistor Tsen is not turned on. The voltage VP1 is selected based on this observation.

Figure 8:
FIG. 8 illustrates various combinations of a part of voltages and states of the semiconductor memory device according to the first embodiment.

The voltage VP1 is determined such that the transistor Tsen connected to the node SEN connected to the selected cell transistor MT having a threshold voltage lower than the voltage BVL1 is turned on in a case where the voltage of the node LOP is lower than the voltage VP1 and is turned off in a case where the node LOP is biased to the voltage VP1. By using the voltage VP1, the transistor Tsen electrically connected to the selected cell transistor MT having the threshold voltage lower than the verification voltage BVL1 is turned on in a case where the node LOP has the voltage Vss (refer to (A)), and is turned off in a case where the node LOP is biased to the voltage VP1 (refer to (D)), as illustrated in FIG. 8. Meanwhile, the transistor Tsen electrically connected to the selected cell transistor MT having the threshold voltage higher than or equal to the verification voltage BVL1 is turned on even in a case where the node LOP is biased to the voltage VP1 (refer to (E) and (F)). Hence, it is possible to determine whether or not the selected cell transistor MT connected to the transistor Tsen has the threshold voltage higher than or equal to the voltage BVL1 on the basis of turn-on or turn-off of the transistor Tsen. The transistor Tsen electrically connected to the selected cell transistor MT having the threshold voltage higher than or equal to the verification voltage BVL1 is naturally turned on even in a case where the node LOP is not biased (refer to (B) and (C)).

Description will be made again with reference to FIG. 7. In addition, the sequencer 14 turns on transistors 51T, 53T, and 56T of the data latch circuit TDL from time t8. As a result, a state of two inverter circuits, which are cross-connected, including a set of transistors 52T, 54T, 57T, 58T is settled, a node LAT_T includes the voltage Vddsa, and a node INV_T has the voltage VP1. In addition, the voltage of the bus SBUS connected to the node LAT_T also becomes the voltage Vddsa.

The sequencer 14 makes the signal STB have a voltage Vstb over a short period of time from time t11, while the node LOP has the voltage VP1. The voltage Vstb has a magnitude for allowing the transistor Tstb to transfer a voltage. By applying the voltage Vstb, the transistor Tstb is turned on. As a result, a drain of the transistor Tsen is electrically connected to the bus SBUS.

By applying the voltage Vstb, the voltage of the bus SBUS, furthermore, a voltage of the node LAT_T decreases to the voltage VP1, in a case where the transistor Tsen is turned on regardless of degree. By doing so, the voltage VP1 of the node LAT_T is retained in the data latch circuit TDL as information indicating that the transistor Tsen is turned on, that is, information indicating that the selected cell transistor MT connected to the transistor Tsen has the threshold voltage higher than or equal to the voltage BVL1.

Meanwhile, in a case where the transistor Tsen is turned off, the voltage of the bus SBUS, furthermore, the voltage of the node LAT_T is maintained as the voltage Vddsa also by applying the voltage Vstb. By doing so, the voltage Vddsa of the node LAT_T is retained in the data latch circuit TDL as information indicating that the transistor Tsen is turned off, that is, information indicating that the selected cell transistor MT connected to the transistor Tsen has the threshold voltage lower than the verification voltage BVL1.

As such, an operation of retaining one piece of information in the data latch circuit TDL (or SDL) on the basis of the voltage of the node SEN when transition of the signal STB to the voltage Vstb is performed by transition of the signal STB to the voltage Vstb, is referred to as strobe.

The sequencer 14 determines that the selected cell transistor MT having the threshold voltage lower than the verification voltage BVL1 fails in verification VFL1, based on data of each data latch circuit TDL. Meanwhile, the sequencer 14 determines that the selected cell transistor MT having the threshold voltage higher than or equal to the verification voltage BVL1 passes the verification VFL1.

From time t18, the sequencer 14 biases voltages of the node LOP and the node LOP_LT to a voltage VPm. The voltage VPm is higher than the voltage VP1. In addition, the voltage VPm has a magnitude for allowing the transistor Tsen connected to the node SEN connected to the cell transistor MT having the threshold voltage of a magnitude less than the verification voltage BV for the B level which is a current verification target to be turned off, and for allowing the transistor Tsen connected to the node SEN connected to the cell transistor MT having the threshold voltage of a magnitude higher than or equal to the verification voltage BV, to be turned on. That is, as the node LOP has the voltage VPm, the gate-source voltage Vgs of the transistor Tsen is lower than a case where the node LOP has the voltage Vp1. Accordingly, in a case where the node LOP is biased to the voltage VPm, the transistor Tsen is difficult to be turned compared with a case where the node is not biased, when the same voltage is applied to a gate thereof. That is, in a case where the node LOP is biased to the voltage VPm, if a value which is obtained by subtracting the voltage VPm from the voltage of the node SEN is not higher than or equal to the threshold voltage of the transistor Tsen, the transistor Tsen is not turned on. The voltage VPm is selected based on this observation.

The voltage VPm is determined such that the transistor Tsen connected to the node SEN connected to the selected cell transistor MT having a threshold voltage lower than the verification voltage BV higher than or equal to the verification voltage BVL1 is turned on in a case where the voltage of the node LOP is lower than the voltage VPm and is turned off in a case where the node LOP is biased to the voltage VPm. By using the voltage VPm, the transistor Tsen electrically connected to the selected cell transistor MT having the threshold voltage lower than the verification voltage BVL1 is first turned off (refer to (G)), as illustrated in FIG. 8. In addition, the transistor Tsen electrically connected to the selected cell transistor MT having the threshold voltage higher than or equal to the verification voltage BVL1 and lower than the verification voltage BV is turned on in a case where the node LOP is biased to the voltage VP1 (refer to (E)), but is turned off in a case where the node LOP is biased to the voltage VPm (refer to (H)). Meanwhile, the transistor Tsen electrically connected to the selected cell transistor MT having the threshold voltage higher than or equal to the verification voltage BV is turned on even in a case where the node LOP is biased to the voltage VPm (refer to (I)). Hence, it is possible to determine whether or not the selected cell transistor MT connected to the transistor Tsen has the threshold voltage higher than or equal to the voltage BV on the basis of turn-on or turn-off of the transistor Tsen.

Description will be made again with reference to FIG. 7. In addition, the sequencer 14 turns on transistors 51S, 53S, and 56S of the data latch circuit SDL from time t18. As a result, a state of two inverter circuits, which are cross-connected, including a set of transistors 52S, 57S, 54S, and 58S is settled, a node LAT_S includes the voltage Vddsa, and a node INV_S has the voltage VPm. In addition, the voltage of the bus SBUS connected to the node LAT_S also becomes the voltage Vddsa.

The sequencer 14 performs the strobe by setting the signal STB as the voltage Vstb over a short period of time from time t19, while the node LOP has the voltage VPm. By applying the voltage Vstb, the voltage of the bus SBUS, furthermore, the voltage of the node LAT_S decreases to the voltage VPm in a case where the transistor Tsen is turned on. By doing so, the voltage VPm of the node LAT_S is retained in the data latch circuit SDL as information indicating that the transistor Tsen is turned on, that is, information indicating that the selected cell transistor MT connected to the transistor Tsen has the threshold voltage higher than or equal to the voltage BV.

Meanwhile, in a case where the transistor Tsen is turned off, the voltage of the bus SBUS, furthermore, the voltage of the node LAT_S is maintained as the voltage Vddsa also by applying the voltage Vstb. By doing so, the voltage Vddsa of the node LAT_S is retained in the data latch circuit SDL as information indicating that the transistor Tsen is turned off, that is, information indicating that the selected cell transistor MT connected to the transistor Tsen has the threshold voltage lower than the verification voltage BV.

A plurality of number of strobes of the node LOP which is performed at different voltages can be performed in any order, and is not limited to the order of FIG. 7.

The sequencer 14 determines that the selected cell transistor MT having the threshold voltage lower than the verification voltage BV fails in verification VF2, based on data of each data latch circuit SDL. Meanwhile, the sequencer 14 determines that the selected cell transistor MT having the threshold voltage higher than or equal to the verification voltage BV passes the verification VF2.

At time t20, the sequencer 14 returns the voltages of the node LOP and the node LOP_LT to the voltage Vss. Thereby, verification of FIG. 7 is completed.

Figure 9:
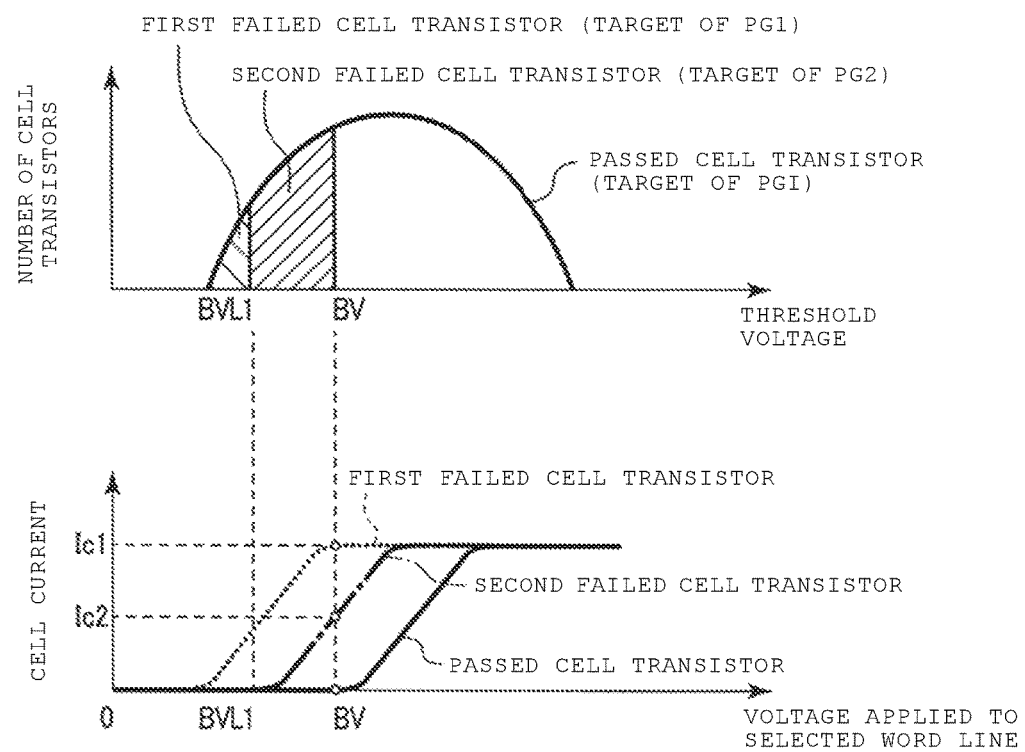
FIG. 9 illustrates relationships between one state and a cell current of a selected transistor of the semiconductor memory device according to the first embodiment and a voltage which is applied to a selected word line.

FIG. 9 illustrates distribution of the threshold voltages of the selected cell transistor MT after verification of FIG. 7 is completed, illustrates states of the semiconductor memory device 1 according to the first embodiment, and illustrates distribution of the threshold voltages of the selected cell transistor MT to which data is written in the B level.

As illustrated in FIG. 9, the selected cell transistor MT which is determined to fail the verification VFL1 (depicted in FIG. 9 as first failed cell transistor) has the threshold voltage lower than the verification voltage BVL1, and a cell current Ic1 flows therethrough in a case where a voltage of the selected word line WL is the verification voltage BV.

A cell current flows through the selected cell transistor MT which is determined to pass the verification VF2 (depicted in FIG. 9 as passed cell transistor), in a case where the voltage of the selected word line WL is higher than or equal to the verification voltage BV.

The selected cell transistor MT which is determined to pass the verification VFL1 and to fail the verification VF2 is indexed to have the threshold voltage higher than or equal to the verification voltage BVL1 and lower than the verification voltage BV. The selected cell transistor which is determined to pass the verification VFL1 and to fail the verification VF2 is depicted in FIG. 9 as second failed cell transistor. In the second failed cell transistor MT, in a case where the voltage of the selected word line WL is lower than the verification voltage BVL1, the cell current does not flow, and in a case where the voltage of the selected word line WL is higher than or equal to the verification voltage BVL1, the cell current flow. In a case where the voltage of the selected word line WL is the verification voltage BV, a cell current Ic2 flows through the second failed cell transistor MT. The cell current Ic2 is smaller than the cell current Ic1.

The sequencer 14 performs an $(x+1)^{th}$ program loop after an $x^{th}$ program loop including the verification of FIG. 7 is performed. The sequencer 14 executes a program on the basis of results of the verification of FIG. 7 in the $(x+1)^{th}$ program loop. The sequencer 14 executes a program PG1 for the first failed cell transistor. The sequencer 14 executes a program PG2 for the second failed cell transistor. The sequencer 14 executes a program PGI for the passed cell transistor.

Figure 10:
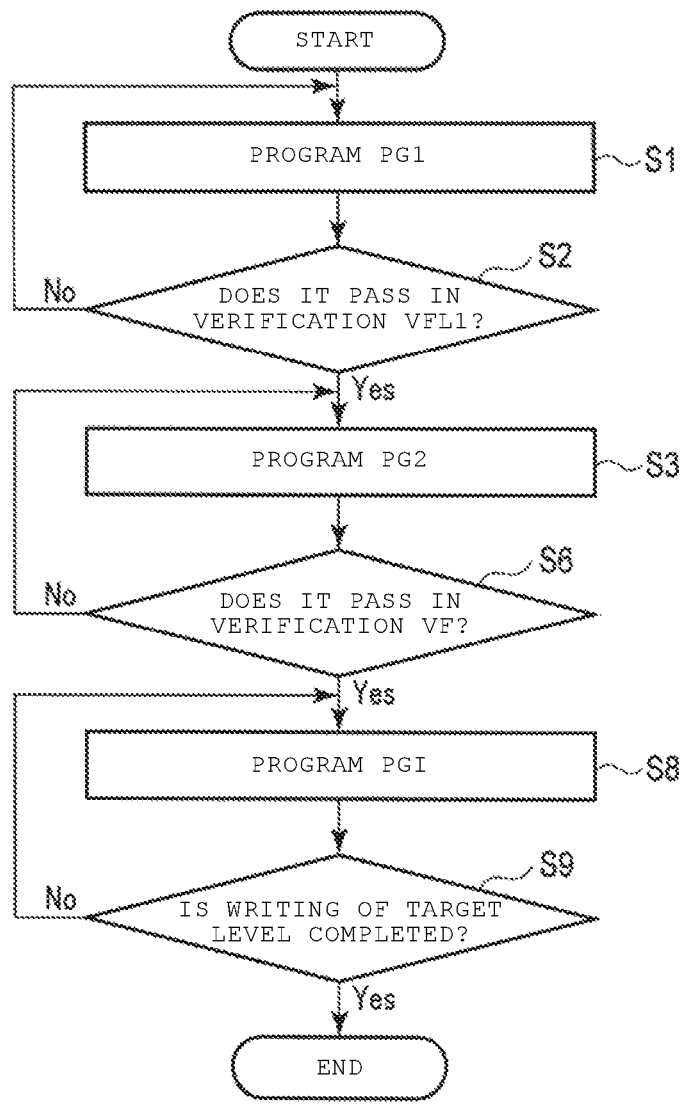
FIG. 10 illustrates a flow of writing data to a selected transistor of the semiconductor memory device according to the first embodiment.

FIG. 10 illustrates a flow of steps until a selected cell transistor MT in the first embodiment passes verification of any target level (for example, the B level). As illustrated in FIG. 10, the sequencer 14 performs the program PG1 (step S1), and subsequently, performs the verification VFL1 (step S2). A set of step S1 and step S2 is included in any one program loop.

If the selected cell transistor MT is determined to fail the verification VFL1 (No branch of step S2), the sequencer 14 performs steps S1 and S2 again in a next program loop. If the selected cell transistor MT is determined to pass the verification VFL1 (Yes branch of step S2), the sequencer 14 performs step S3 in the next program loop. The sequencer 14 performs the program PG2 in step S3. Subsequently, the sequencer performs the verification VF (step S6). Steps S3 and S6 are included in any one program loop.

If the selected cell transistor MT is determined to fail the verification VF (No branch of step S6), the sequencer 14 performs steps S3 and S6 again in a next program loop. If the selected cell transistor MT is determined to pass the verification VF (Yes branch of step S6), the sequencer 14 executes a program PGI in the next program loop (step S8). The sequencer 14 no longer performs further verification for the selected cell transistor MT which passes the verification VF.

The sequencer 14 determines whether or not writing of a target level is completed in step S9. Writing of the target level is completed, for example, if it is determined that a certain ratio of the total number of the selected cell transistors MT in which writing of the target level is performed passes the verification VF. If writing of the target level is not completed (No branch of step S9), the sequencer 14 performs step S8 again in a next program loop. Meanwhile, if writing of the target level is completed (Yes branch of step S9), the flow ends.

Figure 11:
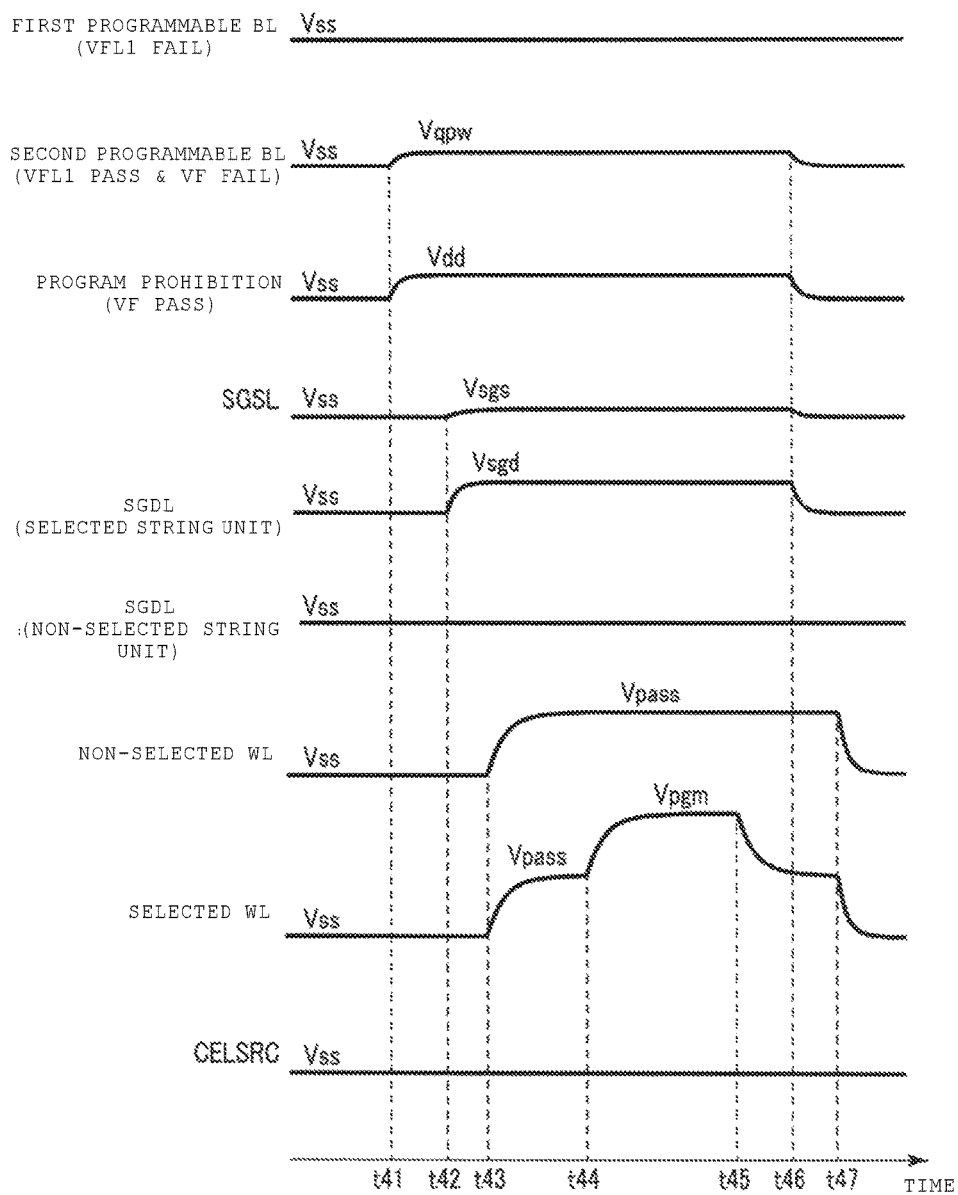
FIG. 11 is a timing diagram of voltages of several wires during a part of writing of the semiconductor memory device according to the first embodiment.

FIG. 11 is a timing diagram of voltages of several wires while programs are executed in a certain program loop of the semiconductor memory device 1 according to the first embodiment. The programs of FIG. 11 include the programs PG1, PG2, and PGI. The programs PG1, PG2, and PGI are executed in parallel with respect to one selected cell unit SU as voltages illustrated in FIG. 11 are applied. That is, writing is performed in parallel with respect to the selected cell transistor MT in the selected cell unit CU, and the sequencer 14 respectively executes the programs PG1, PG2, and PGI in parallel for the first failed cell transistor MT, the second failed cell transistor MT, and the selected cell transistor MT.

As illustrated in FIG. 11, the sequencer 14 continuously applies the voltage Vss to the source line CELSRC while the programs PG1, PGM2, and PGI are executed. In addition, the sequencer 14 continuously applies the voltage Vss to the bit line BL connected to the string STR including the first failed cell transistor MT which fails the verification VFL1 by controlling the sense amplifier circuit SAC, while the programs PG1, PGM2, and PGI are executed.

From time t41, the sequencer 14 sets a voltage of the bit line BL connected to the string STR including the second failed cell transistor MT which passes the verification VFL1 and fails the verification VF, to a voltage Vqpw by controlling the sense amplifier circuit SAC. The voltage Vqpw is slightly higher than the voltage Vss and is lower than the voltage Vdd.

In addition, the sequencer 14 sets the voltage of the bit line BL connected to the string STR including the passed cell transistor MT, to the voltage Vdd from time t41 by controlling the sense amplifier circuit SAC. The voltage Vdd is higher than the voltage Vqpw.

The sequencer 14 applies a voltage Vsgs to the selection gate line SGSL from time t42. The voltage Vsgs is higher than the voltage Vss, and has a magnitude for not turning on a selection gate transistor SST. Accordingly, a set of the cell transistors MT connected in series is not connected to the source line CELSRC in any string STR.

In addition, the sequencer 14 applies the voltage Vsgd to the selection gate line SGDL of the selected string unit SU from time t42. The voltage Vsgd has a magnitude for maintaining a selection gate transistor SDT in the first programmable select string STR and the second programmable string STR and for turning on the selection gate transistor SDT in the program-prohibited select string STR.

While the voltage Vsgd is applied, the selection gate transistors SDT in the first and second programmable select strings STR are turned on. Accordingly, channels of the first and second programmable select strings STR are continuously connected to the corresponding bit line BL. During this time, the channel of the first programmable select string STR maintains a state where the voltage Vss is applied, and the channel of the second programmable string STR maintains a state where the voltage Vqpw is applied.

Meanwhile, by applying the voltage Vsgd, the selection gate transistor SDT in the program-prohibited select string STR is not turned on. Accordingly, the channel of the program-prohibited select string STR is disconnected from the corresponding bit line BL thereby being electrically floated from the time t42.

The sequencer 14 applies a voltage Vpass to the selected word line WL and the non-selected word line WL from time t43. The voltage Vpass is higher than the voltage Vss and has a magnitude which is large enough to turn on the cell transistor MT connected to non-selected word line WL such that a voltage from the bit line BL can be transferred in the first and programmable select strings STR and is small enough to prevent an unintended program form the non-selected cell transistor MT from being generated. Furthermore, the voltage Vpass is large enough to increase the channel by coupling such that the threshold of the cell transistor MT is prevented from increasing in the program-prohibited select string STR.

The sequencer 14 applies the voltage Vpgm to the selected word line WL from time t44. The voltage Vpgm is higher than the voltage Vpass. By applying the voltage Vpgm, a voltage difference is formed by the voltage Vpgm and the voltage Vss between the selected word line WL and the channel, in the first programmable select string STR. As a result, electrons are injected into the charge storage layer CA of the first failed cell transistors MT of each of the first programmable select strings STR, and the program PG1 is executed.

In addition, by applying the voltage Vpgm, a voltage difference is formed by the voltage Vpgm and the voltage Vqpw between the selected word line WL and the channel, in the second programmable string STR. As a result, electrons are injected into the charge storage layer CA of the second failed cell transistors MT of each of the second programmable strings STR, and the program PG2 is executed. The voltage difference between the selected word line WL and the channel of the second failed cell transistor MT is smaller than the voltage difference between the selected word line WL and the channel of the first failed cell transistor MT. Accordingly, the electrons which are injected into the charge storage layer CA of the second failed cell transistor MT by the program PG2 are less than electrons which are inserted into the charge storage layer CA of the first failed cell transistor MT by the program PG1. Hence, increase of the threshold voltage of the second failed cell transistor MT is less than increase of the threshold voltage of the first failed cell transistor MT.

Meanwhile, since the voltage Vpass is sufficiently lower than the voltage Vpgm, a voltage difference formed by the voltage Vpass and the voltage Vss between the non-selected word line WL and the channel is sufficiently smaller than a difference between the voltage Vpgm and the voltage Vss, in the first and second programmable select string STR. Accordingly, no or few electrons are injected into the charge storage layer CA of the non-selected cell transistor MT of the first and second programmable select string STR, such that execution of the programs PG1 and PG2 is suppressed or not performed therein.

In addition, injection of the electrons into the passed cell transistor MT is suppressed or not performed even as the voltage Vpgm is applied. The program-prohibited select string STR is electrically floated, and thus, the voltage of the channel increases by applying the voltage Vpgm and the voltage Vpass to the word lines WL because there is only a small voltage difference between the word lines WL. The program in which injection of the electrons is suppressed by increase of the voltage of the channel corresponds to the program PGI.

At time t45, the sequencer 14 returns the voltage of the selected word line WL to the voltage Vpass. At time t46, the sequencer 14 returns the voltages of the first programmable bit line BL and the program-prohibited bit line BL, the selection gate line SGSL, and the selection gate line SGDL of the selected string unit SU to the voltage Vss. At time t57, the sequencer 14 returns the voltages of the selected word line WL and the non-selected word line WL to the voltage Vss.

Advantages (Effects)

The semiconductor memory device according to the first embodiment can complete verification at a high speed. Details are as follows.

As described above, the voltage Vpgm which is applied to the selected word line WL increases by increase amount ΔVPGM every program loop. The increase amount ΔVPGM is basically fixed. Accordingly, the threshold voltage of a certain selected cell transistor MT can excessively increase as the voltage Vpgm is applied. Specifically, the threshold voltage of a magnitude slightly less than a certain the verification voltage γV (γ is A, B, or C) may significantly exceed the verification voltage γV. The threshold voltage may reach an adjacent level, and this may cause a read error. In order to prevent the excessive threshold voltage from increasing, a certain selected cell transistor MT is programmed more weakly than the selected cell transistor MT which fails in verification. Hence, the selected cell transistor MT to be weakly programmed needs to be specified in addition to specification of the selected cell transistors which pass and fail in verification. That is, it is necessary to specify the first and second failed cell transistors and the passed cell transistor MT.

Verification voltages γVL and γV are sequentially applied to the selected word lines WL, and strobe is performed while each of the verification voltages γVL and γV is applied, as a first method for performing verification. However, since the selected word line WL needs large capacitance and it takes time to charge the word line, it takes time to specify the first and second failed cell transistors and the passed cell transistor MT.

The node SEN is connected to the corresponding bit line BL over a first period of time (referred to herein as a first sense period), strobe is performed, those are connected again over a second period of time (referred to herein as a second sense period) longer than the first period of time, and the strobe is performed again, as a second method. The first and second periods of time are controlled according to the period of time in which the transistor Txxl is turned on, and the voltage Vxxl is applied to the signal XXL during each of the first and second periods of time in the same manner as in FIG. 7. In addition, the verification voltage γV is applied to the selected word line WL even during both the first and second periods of time. By applying the verification voltage γV, the second failed cell transistor MT having a voltage which is slightly less than the verification voltage γV is turned on, and thus, the degree is weak, a cell current decreases, and the voltage of the bit line BL slightly decreases. In addition, the node SEN and the bit line BL are not connected to each other only for a short period of time in the first period of time. Accordingly, the voltage of the bit line BL is not sufficiently transferred to the node SEN. Hence, the voltage of the node SEN connected to the second failed cell transistor MT does not sufficiently decrease, and the corresponding transistor Tsen is maintained to be turned on.

Meanwhile, since the node SEN and the bit line BL are connected to each other over a long period of time in the second period of time, the voltage of the bit line BL is sufficiently transferred to the node SEN, and thus, the voltage of the node SEN connected to the second failed cell transistor MT sufficiently decreases. Accordingly, the corresponding transistor Tsen is turned off. The transistor Tsen is maintained to be turned on in the first period of time, and the selected cell transistor MT which is turned off in the second period of time is determined to be the second failed cell transistor.

However, although the second method is faster than the first method, connection between the node SEN and the bit line BL is required twice at one γ level, and it still takes a long time.

In the first embodiment, after connection between the node SEN and the bit line BL is performed once at one γ level, the voltage VP1 is applied to the node LOP, strobe is performed, the voltage VPm is applied to the node LOP, and the strobe is performed. The same verification voltage γV is applied to the selected word line WL and the voltage applied to the node LOP is changed. However, the voltage of the node LOP and a gate-source voltage Vsg of the transistor Tsen are different from each other during two strobes, and if the voltage of the node LOP increases, the node SEN needs to have a higher voltage for maintaining the transistor Tsen as a turned-on state. Accordingly, although the selected cell transistor MT which is weakly turned on can be maintained to be turned on while the voltage VP1 is applied, the cell transistor can be turned off while the voltage VPm is applied. The selected cell transistor MT has a voltage slightly lower than the verification voltage γV, and more specifically, has the threshold voltage higher than or equal to the verification voltage γVL and lower than the verification voltage γV. By doing so, the second failed cell transistor MT can be indexed.

In addition, after connection between the node SEN and the bit line BL is performed once at one γ level, the first failed cell transistor MT can also be indexed in parallel with the passed cell transistor MT through the strobe while each of the voltage VP1 and the voltage VPm is applied. That is, the first failed cell transistor MT is connected to the transistor Tsen which is turned off at the time of strobe while the voltage VP1 is applied, and the passed cell transistor MT is connected to the transistor Tsen which is turned on at the time of strobe while the voltage VPm is applied. Hence, the first and second failed cell transistors MT and the passed cell transistor MT can be indexed in parallel with each other through the strobe while each of the voltage VP1 and the voltage VPm is applied, after connection between the node SEN and the bit line BL is performed once at one γ level.

In addition, according to the first embodiment, a voltage which is applied to the selected word lines WL has one magnitude at one γ level. Accordingly, in the first embodiment, it is not necessary to charge the selected word lines WL with a plurality of different voltages in the same manner as the first method, and charging is completed faster than the first method. In the first embodiment, the node VOP is charged to different voltages, but charging the node VOP does not require a long time, such as charging the selected word line WL.

Furthermore, according to the first embodiment, connection between the node SEN and the bit line BL for verification of one γ level is performed only once. Accordingly, verification of the first embodiment is completed faster than the second method.

In addition, in the first embodiment, the nodes LOP_LT of sources of the transistors 57S, 58S, 57T, and 58T of the data latch circuits SDL and TDL are controlled in the same manner as the voltage of the node LOP during verification. By doing so, results of different verifications of two conditions according to control of the voltage of the node LOP according to the first embodiment can be conveniently retained in the data latch circuits SDL and TDL. Details are as follows.

It is assumed that sources of transistors 57δ (each of δ is S and T) and 58δ of FIG. 5 are fixed to the voltage Vss, as an example for reference. Then, a latch circuit δDL retains the voltage Vddsa or Vss in a node LAT_δ in accordance with data which is retained. That is, the latch circuit δDL retains data, based on whether the voltage of the bus SBUS is Vddsa or Vss. Strobe is performed in a state where the node LAT_δ and the bus SBUS retains the voltage Vddsa, such that results of the strobe are transferred to the latch circuit δDL. As a result of the strobe, the voltage of the bus SBUS decreases or is maintained as it is, based on turn-on or turn-off of the transistor Tsen. In a case where the transistor Tsen is turned on, the voltage of the bus SBUS decreases only to the voltage VP1 or VPm (hereinafter, each can be referred to as a voltage VP) of the node LOP. In this state, there is a possibility that it is not correctly determined by the latch circuit γDL that the bus SBUS is at a low level.

A method in which the voltage VP of the bus SBUS is converted into the voltage Vss after the strobe is performed and the converted voltage is transferred to the data latch circuit γDL is considered to address such a phenomenon. That is, after the strobe is performed, the node LOP has the voltage Vss, and subsequently, the transistors Tblq and 30 are turned on. As a result, the transistor 31 is turned on or off by the voltage of the bus SBUS, and the bus SBUS is discharged to Vss through the transistors Tblq, 30, and 31, but is maintained as the voltage Vddsa. That is, the results of the strobe appear in the bus SBUS as the voltage Vddsa or Vss.

However, according to the method, a voltage retained in the node SEN is lost by turn-on of the transistor Tblq.

According to the first embodiment, the node LOP_LT is controlled in the same manner as the voltage of the node LOP during verification. Accordingly, the latch circuit γDL can correctly retain data, based on the voltage Vddsa or the voltage VP of the bus SBUS. Moreover, it is not necessary to convert the voltage VP of the bus SBUS based on the results of the strobe into the voltage Vss in the same manner as in the method of a reference example. Accordingly, the voltage of the node SEN is not damaged, and strobe can be performed twice by a plurality of voltages VP with difference magnitudes and the voltage of the node SEN.

Second Embodiment

A second embodiment is different from the first embodiment in detailed points of the sense amplifier 17 and the data latch 19. Hereinafter, points different from the first embodiment will be mainly described.

Figure 12:
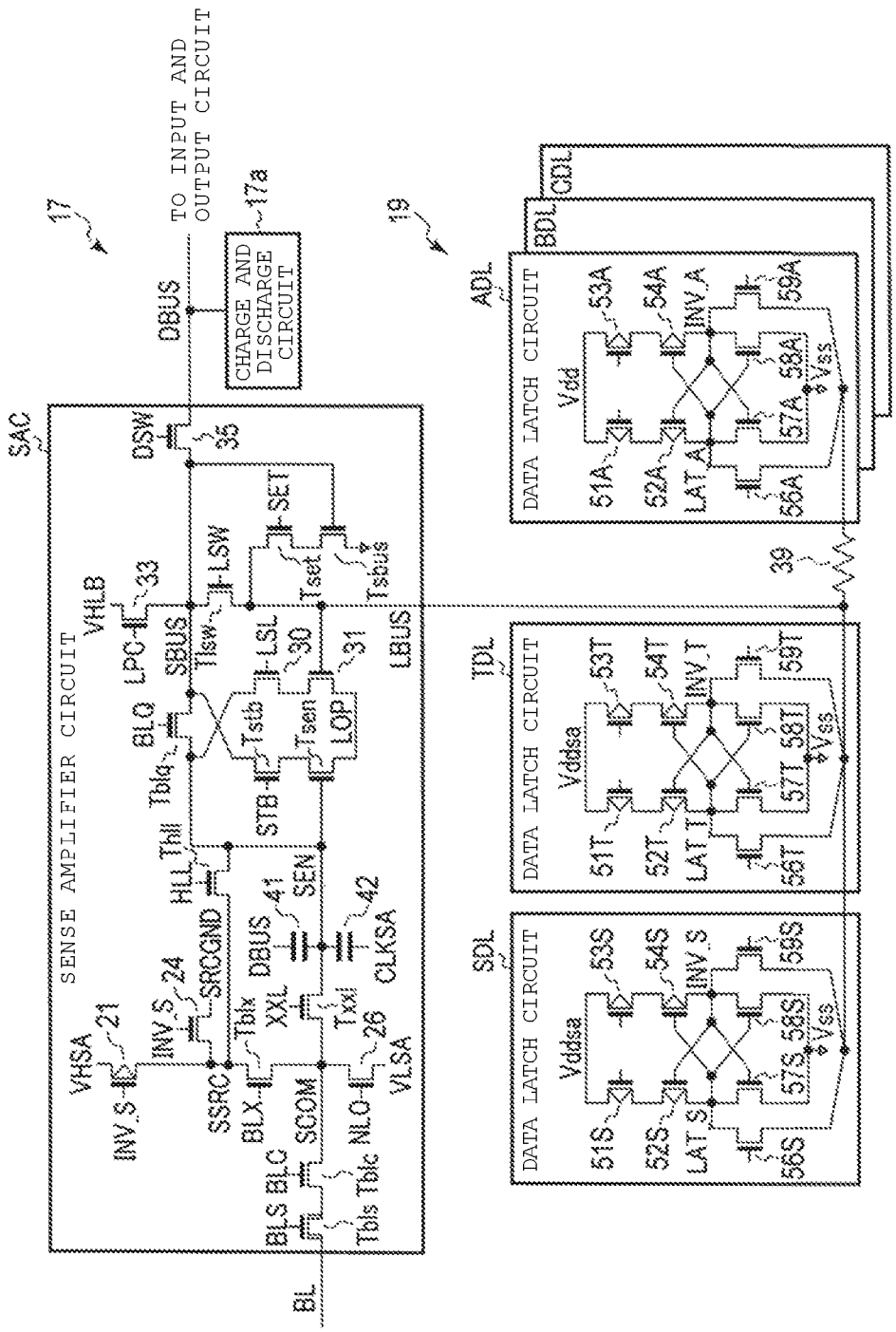
FIG. 12 illustrates a part of elements and connections of a sense amplifier and a data latch according to a second embodiment.

FIG. 12 illustrates a part of the sense amplifier 17 and the data latch 19 according to a second embodiment. In the second embodiment, details of the sense amplifier circuit SAC and data latch circuits SDL, TDL, ADL, BDL, and CDL are different from those according to the first embodiment. The sense amplifier circuit SAC includes all the elements and connections illustrated in FIG. 12. In a case of each of β=S and T, the data latch circuit βDL has all the elements and connections illustrated in FIG. 12. In a case of each of γ=A, B, and C, the data latch circuit γDL has all the elements and connections illustrated in FIG. 12.

As illustrated in FIG. 12, a bus LBUS is grounded (connected to a node of the voltage Vss) through an n-type MOSFETs Tset and Tsbus which are connected in series. A gate of the transistor Tset accepts, for example, a signal SET from the sequencer 14. A gate of the transistor Tsbus is connected to the bus SBUS.

A gate of the transistor 31 is connected to the bus LBUS. Sources of each of transistors 57S, 58S, 57T, and 58T are grounded. Sources of each of the transistors 57A, 58A, 57B, 58B, 57C, and 58C are connected to the bus LBUS through a resistance element 39.

Figure 13:
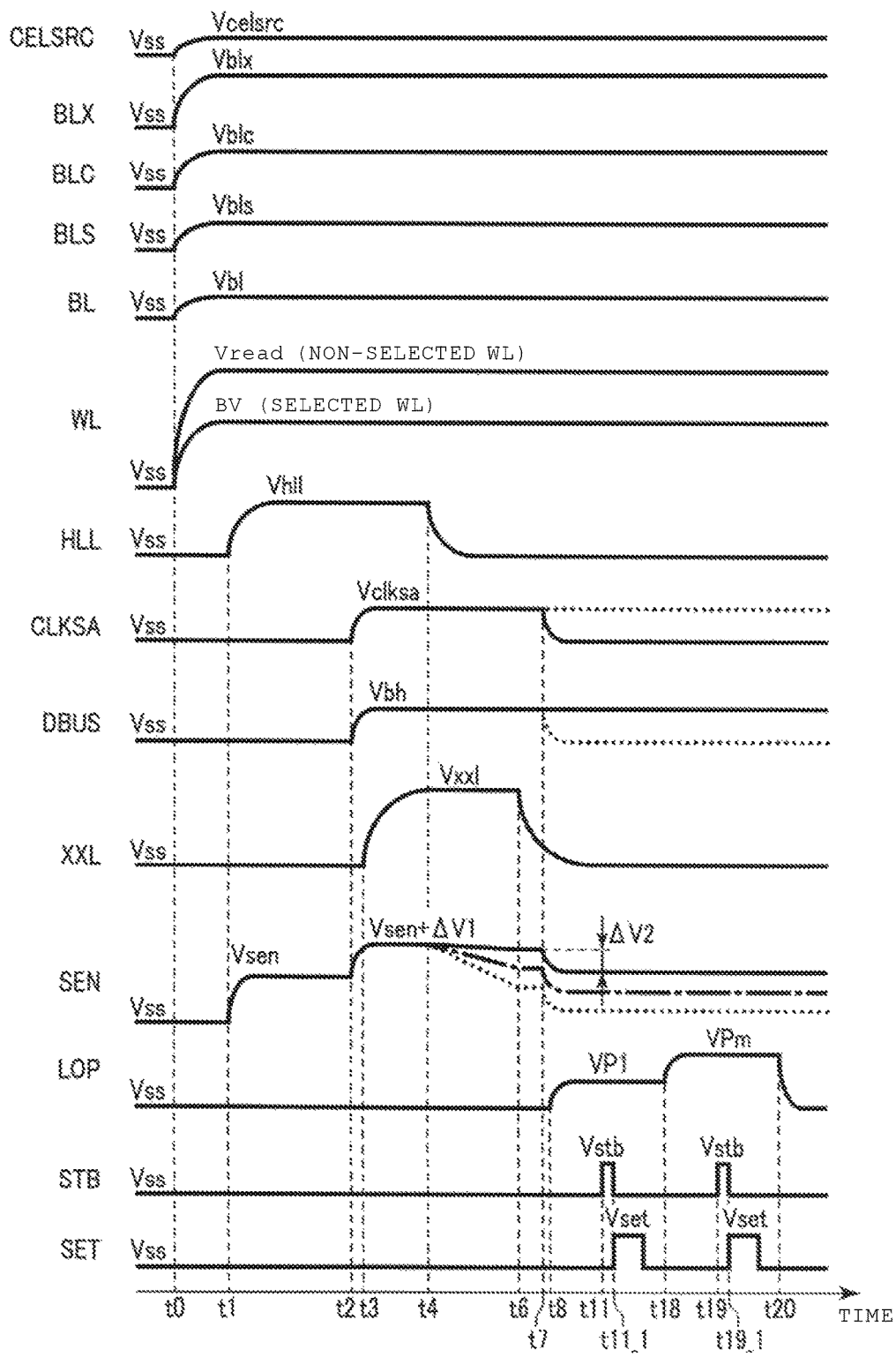
FIG. 13 is a timing diagram of voltages of several wires during verification of the semiconductor memory device according to the second embodiment.

Voltages of the wires during verification are illustrated in FIG. 13. A transistor Tlsw is maintained to be turned off during verification. FIG. 13 is a timing diagram of the voltages which are applied to several wires during verification in any one program loop.

As illustrated in FIG. 13, the sequencer 14 sets a voltage of the signal SET as a voltage Vset at time t11_1 after strobe is performed from time t11. The voltage Vset has a magnitude for allowing the transistor Tset to transfer a voltage to be transferred. By applying the voltage Vset, the transistor Tset is turned on. As a result, if the bus SBUS has the voltage Vddsa, the transistor Tsbus is turned on and the bus LBUS is pulled to the voltage Vss. The voltage Vss of the bus LBUS pulls a node INV_S to the voltage Vss through a transistor 59S, and as a result, the voltage Vddsa is retained in the node LAT_S.

Meanwhile, if the bus SBUS has the voltage VP1, the transistor Tsbus is maintained to be turned off, and the bus LBUS maintains the voltage Vddsa. The voltage Vddsa of the bus LBUS maintains the node INV_S as the voltage Vddsa through the transistor 59S, and as a result, the voltage Vss is retained in the node LAT_S.

Since only the voltage of the node LOP is different, strobe from time t43 is the same as the strobe from time t11 and includes transition to the voltage Vset of the signal SET from time t19_1.

In the second embodiment, a voltage which is applied to the selected word line WL also has one level, and the node SEN and the bit line BL are also connected only once for one γ level, in the same manner as in the first embodiment. Accordingly, the same advantages as in the first embodiment are obtained.

In addition, according to the second embodiment, sources of the transistors 57δ and 58δ are grounded, and do not control voltages in the same manner as in the first embodiment. Accordingly, connection and control of the circuit are simple in the same manner as the first embodiment.

Third Embodiment

In a third embodiment, the transistors MT are classified into more types than those of the first and second embodiments in accordance with verification.

The semiconductor memory device 1 according to the third embodiment has the same elements and connections as those of the first embodiment. However, in the third embodiment, the semiconductor memory device 1 is configured to perform an operation which will be described below. Hereinafter, points different from the first embodiment will be mainly described.

Operation

Figure 14:
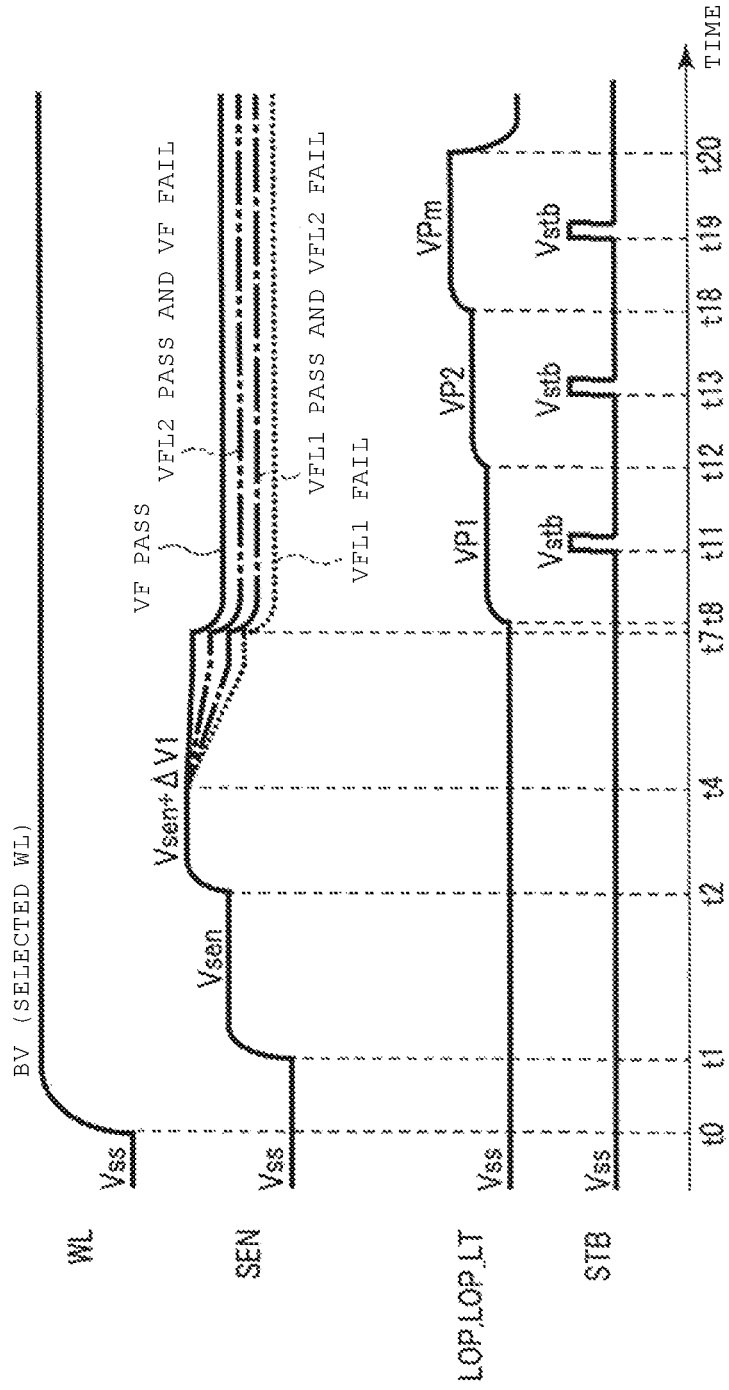
FIG. 14 is a timing diagram of voltages of several wires during verification of a semiconductor memory device according to a third embodiment.

FIG. 14 is a timing diagram of voltages which are applied to several wires during verification in an $x^{th}$ program loop in the semiconductor memory device 1 according to the third embodiment in the same manner as in FIG. 7 of the first embodiment. FIG. 14 and the following description also relate to verification for the selected cell transistor MT to which data is written in the B level. In addition, FIG. 14 does not include depiction on the voltages of the source line CELSRC, the signals BLX, BLC, and BLS, the bit line BL, the non-selected word lines WL, signals HLL and CLKSA, the bus DBUS, and the signal XXL, which have the same configuration as illustrated in FIG. 7. The omitted voltages and signals also have the same waveforms as in FIG. 7 in verification of FIG. 14.

From time t4, the voltage of the node SEN decreases to a magnitude depending on the threshold voltage of the selected cell transistor MT connected to the node SEN. In FIG. 14, two voltages of the node SEN connected to the selected cell transistor MT which is weakly turned on are denoted by one-dot chain line and two-dot chain line". Generally, a waveform of the two-dot chain line has a value higher than a waveform of one-dot chain line.

From time t12, the sequencer 14 biases voltages of the nodes LOP and LOP_LT to a voltage VP2. The voltage VP2 is higher than the voltage VP1 and lower than the voltage VPm. In addition, the voltage VP2 has a magnitude for allowing the transistor Tsen connected to the node SEN connected to the transistor MT having the threshold voltage of a magnitude less than the verification voltage BVL2 to be turned off, and for allowing the transistor Tsen connected to the node SEN connected to the transistor MT having the threshold voltage of a magnitude higher than or equal to the verification voltage BVL2 to be turned on. That is, the node LOP has the voltage VP2, and the gate-source voltage Vgs of the transistor Tsen is lower than a case where the node LOP has the voltage VP1. Accordingly, in a case where the node LOP is biased to the voltage VP2, the transistor Tsen is not turned on if a value which is obtained by subtracting the voltage VP2 from the voltage of the node SEN is not higher than or equal to the threshold voltage of the transistor Tsen. The voltage VP2 is selected as follows based on this observation.

In a case where the node LOP has the voltage lower than the voltage VP2, the transistor Tsen connected to the node SEN connected to the selected cell transistor MT having the threshold voltage higher than or equal to the verification voltage BVL1 and lower than the verification voltage BVL2 is turned on, and the voltage VP2 is determined to turn off the transistor Tsen in a case where the node LOP is biased to the voltage VP2. By using the voltage VP2, the selected cell transistor MT having the threshold voltage higher than or equal to the verification voltage BVL1 and lower than the verification voltage BVL2 is turned on in a case where the node LOP is biased to the voltage VP1, but is turned off in a case where the node LOP is biased to the voltage VP2. Meanwhile, the selected cell transistor MT having the threshold voltage higher than or equal to the verification voltage BVL2 is turned on even in a case where the node LOP is biased to the voltage VP2. Hence, it is possible to determine whether or not the selected cell transistor MT connected to the transistor Tsen has the threshold voltage higher than or equal to the verification voltage BVL1 and lower than the verification voltage BVL2, based on turn-on or turn-off of the transistor Tsen.

The sequencer 14 performs strobe by setting the signal STB to the voltage Vstb over a short period of time from time t13, while the node LOP has the voltage VP2. Results of the strobe are retained in a further data latch circuit (for example, data latch circuit RDL not illustrated) in the data latch 19.

The sequencer 14 determines that the selected cell transistor MT having the threshold voltage lower than the verification voltage BVL2 fails the verification VF2, based on data in each data latch circuit RDL. The sequencer 14 determines that the selected cell transistor MT having the threshold voltage higher than or equal to the verification voltage BVL2 passes the verification VF2.

From time t18, the sequencer 14 biases the voltages of the nodes LOP and LOP_LT to the voltage VPm. The voltage VPm is selected to satisfy the following conditions in addition to the characteristics described in the first embodiment.

The transistor Tsen connected to the node SEN connected to the selected cell transistor MT having the threshold voltage higher than or equal to the verification voltage BVL2 and lower than the voltage BV is turned on in a case where the node LOP is not biased to the voltage VPm, and the voltage VPm is determined such that the transistor Tsen is turned off in a case where the node LOP is biased to the voltage VPm. By using the voltage VPm, the selected cell transistor MT having the threshold voltage higher than or equal to the verification voltage BVL2 and lower than the voltage BV is turned on in a case where the node LOP is not biased to the voltage VPm, but is turned off in a case where the node LOP is biased to the voltage VPm. Meanwhile, the selected cell transistor MT having the threshold voltage higher than or equal to the verification voltage BV is turned on even in a case where the node LOP is biased to the voltage VPm. Hence, it is possible to determine whether or not the selected cell transistor MT connected to the transistor Tsen has the threshold voltage higher than or equal to the verification voltage BVL2 and lower than the verification voltage BV, based on turn-on or turn-off of the transistor Tsen.

The sequencer 14 performs strobe by setting the signal STB to the voltage Vstb over a short period of time from time t19, while the node LOP has the voltage VPm. Results of the strobe are retained in the data latch circuit SDL.

The sequencer 14 determines that the selected cell transistor MT having the threshold voltage lower than the verification voltage BV fails the verification VF, based on data in each data latch circuit SDL. The sequencer 14 determines that the selected cell transistor MT having the threshold voltage higher than or equal to the verification voltage BV passes the verification VF.

Figure 15:
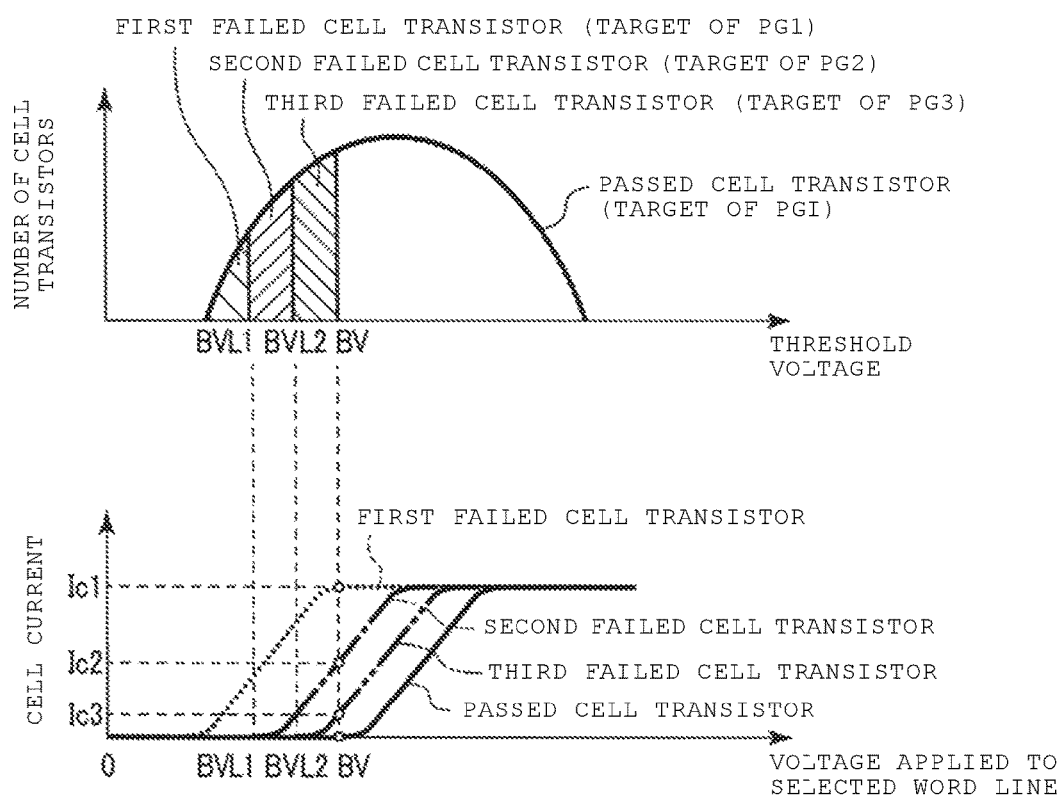
FIG. 15 illustrates a relationship between one state and a cell current of a selected transistor of the semiconductor memory device according to the third embodiment and a voltage which is applied to a selected word line.

FIG. 15 illustrates distribution of the threshold voltages of the selected cell transistor MT after verification of FIG. 14 is completed, illustrates one state of the semiconductor memory device 1 according to the first embodiment, and illustrates distribution of the thresholds of the selected cell transistor MT to which data is written in the B level. FIG. 15 is similar to FIG. 9.

As illustrated in FIG. 15, in the third embodiment, the second failed cell transistor MT passes the verification VFL1, and indicates the selected cell transistor MT which is determined to fail the verification VF2.

The selected cell transistor MT which is determined to pass the verification VF2 and to fail the verification VF is indexed to have the threshold voltage higher than or equal to the verification voltage BVL2 and lower than the voltage BV. The selected cell transistor which is determined to pass the verification VF2 and to fail the verification VF is referred to as a third failed cell transistor. In a case where the voltage of the selected word line WL is lower than the verification voltage BVL2, a cell current does not flow through the third failed cell transistor MT, and in a case where the voltage of the selected word line WL is higher than or equal to the verification voltage BVL2, the cell current flows. In a case where the voltage of the selected word line WL is the verification voltage BV, a cell current Ic3 flow through the third failed cell transistor MT. The cell current Ic3 is smaller than a cell current Ic2.

The sequencer 14 performs an $(X+1)^{th}$ program loop after an $x^{th}$ program loop including the verification of FIG. 14 is performed. The sequencer 14 executes a program on the basis of results of the verification of FIG. 14 in the $(x+1)^{th}$ program loop. The sequencer 14 executes a program PG1 for the first failed cell transistor. The sequencer 14 executes a program PG2 for the second failed cell transistor. The sequencer 14 executes a program PG3 for the third failed cell transistor. The sequencer 14 executes a program PGI for the passed cell transistor.

Figure 16:
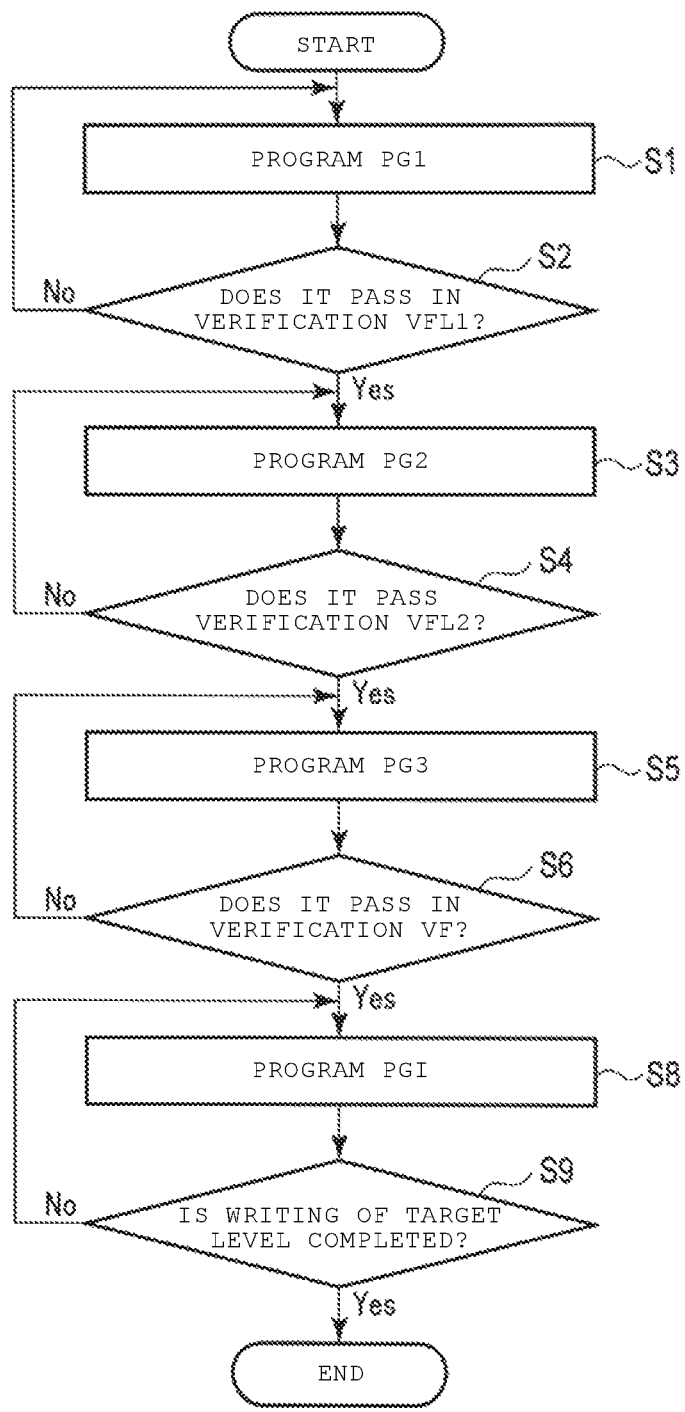
FIG. 16 illustrates a flow of writing data to a selected transistor of the semiconductor memory device according to the third embodiment.

FIG. 16 illustrates a flow of steps until a selected cell transistor MT in the third embodiment passes in verification of any target level (for example, the B level). FIG. 16 is similar to FIG. 10.

As illustrated in FIG. 16, the sequencer 14 performs the verification VFL2 after step S3 (step S4). A set of steps S3 and S4 is included in any one program loop.

If the selected cell transistor MT is determined to fail the verification VFL2 (No branch of step S4), the sequencer 14 performs steps S3 and S4 again in a next program loop. If the selected cell transistor MT is determined to pass the verification VFL2 (Yes branch of step S4), the sequencer 14 performs step S5 in the next program loop. The sequencer 14 performs the program PG3 in step S5. Subsequently, the sequencer performs the verification VF (step S6). Steps S5 and S6 are included in any one program loop.

If the selected cell transistor MT is determined to pass the verification VF (Yes branch) in step S6, the sequencer 14 moves to step S8.

Figure 17:
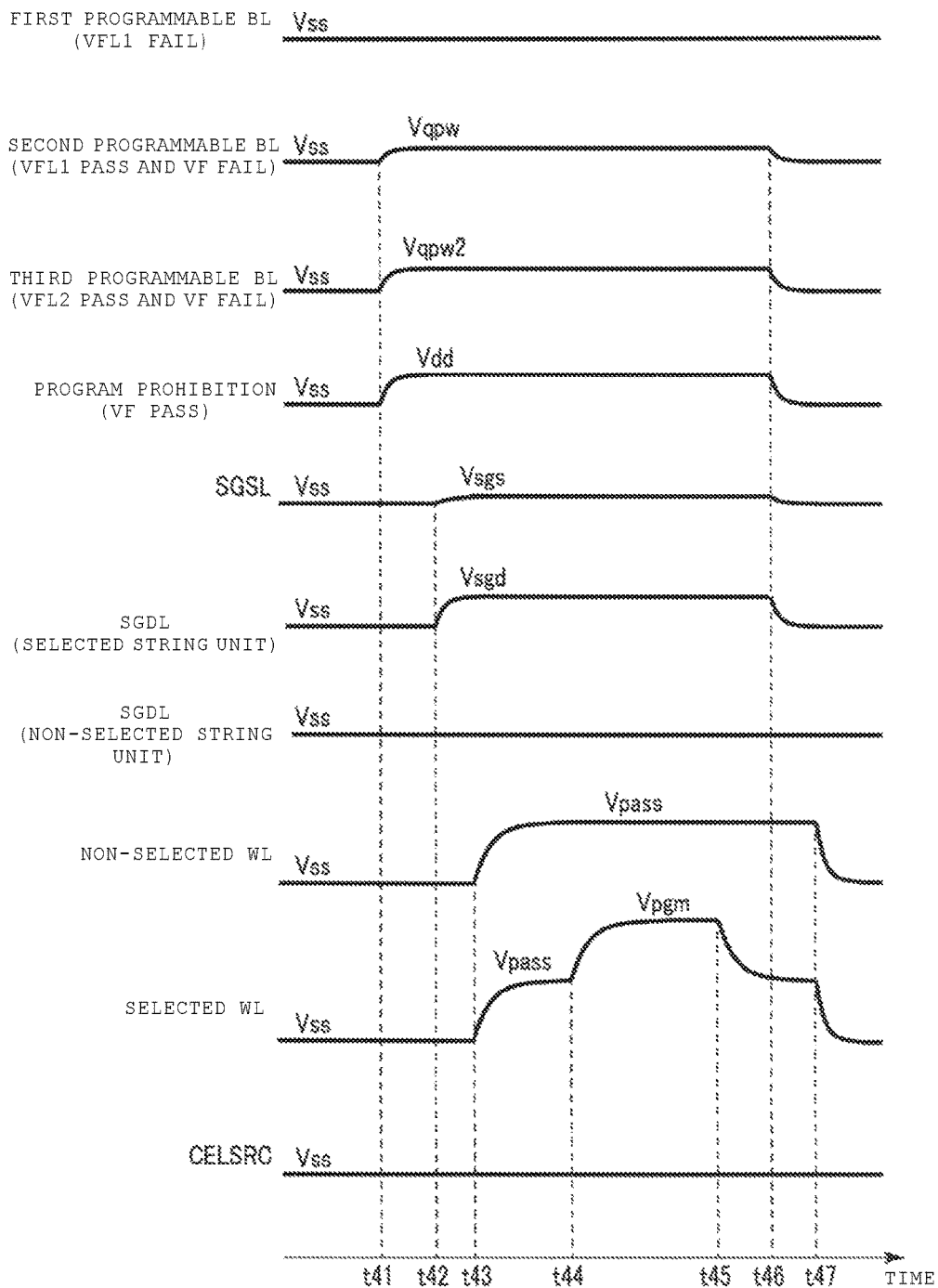
FIG. 17 is a timing diagram of voltages of several wires during a part of writing of the semiconductor memory device according to the third embodiment.

FIG. 17 is a timing diagram of voltages of several wires during while a program is executed in any one program loop of the semiconductor memory device 1 according to the third embodiment. The programs of FIG. 17 include programs PG1, PG2, PG3, and PGI. The programs PG1, PG2, PG3, and PGI are executed in parallel for one selected cell unit SU, as voltages illustrated in FIG. 17 is applied. That is, the sequencer 14 executes the programs PG1, PG2, PG3, and PGI in parallel for the first failed cell transistor, the second failed cell transistor, the third failed cell transistor, and the passed cell transistor MT, respectively.

FIG. 17 is similar to FIG. 11, but is different from FIG. 11 in that a voltage of the bit line BL connected to the string STR including the third failed cell transistor MT which passes the verification VFL2 and fails the verification VF is depicted.

Specifically, from time t41, the sequencer 14 sets the voltage of third programmable bit line BL to a voltage Vqpw2 by controlling the sense amplifier circuit SAC. The voltage Vqpw2 is higher than the voltage Vqpw and is lower than the voltage Vdd.

As the voltage Vpgm is applied from time t44, a voltage difference due to the voltages Vpgm and Vqpw2 is formed between the selected word line WL and the channel, in the third programmable string STR. As a result, electrons are injected into the charge storage layers CA of each of the third failed cell transistor MT of the third programmable string STR, and the program PG3 is executed. The voltage difference between the selected word line WL and the channel of the third failed cell transistor MT is smaller than the voltage difference between the selected word line WL and the channel of the second failed cell transistor MT. Accordingly, the electrons which are injected into the charge storage layer CA of the third failed cell transistor MT by the program PG3 are less than the electrons which are inserted into the charge storage layer CA of the second failed cell transistor MT by the program PG2. Hence, increase of the threshold voltage of the third failed cell transistor MT is less than increase of the threshold voltage of the second failed cell transistor MT.

The sequencer 14 returns the voltage of the third programmable bit line BL to the voltage Vss at the time t45.

By extending the principle described so far, the selected cell transistors MT can be classified into five types or more.

Advantages (Effects)

In the third embodiment, a voltage which is applied to the selected word line WL also has one level, and the node SEN and the bit line BL are also connected only once for one γ level, in the same manner as in the first embodiment. Accordingly, the same advantages as in the first embodiment are obtained.

Furthermore, according to the third embodiment, the selected cell transistor MT having the threshold voltage between the verification voltage γVL and the verification voltage γV is classified into the second failed cell transistor MT having the lower threshold voltage or the third failed cell transistor MT having the higher threshold voltage. By changing conditions of the program PG3 to the second failed cell transistor MT and conditions of the program PG3 to the third failed cell transistor MT, more precise increase of the threshold of the selected cell transistor MT can be controlled. Moreover, indexing of the first to third failed cell transistors MT and the passed cell transistor MT can be performed by applying three voltages to the node LOP and by performing three strobes, and can be completed faster than a case where the method described for reference in the first embodiment is applied.

Modified Example

Figure 18:
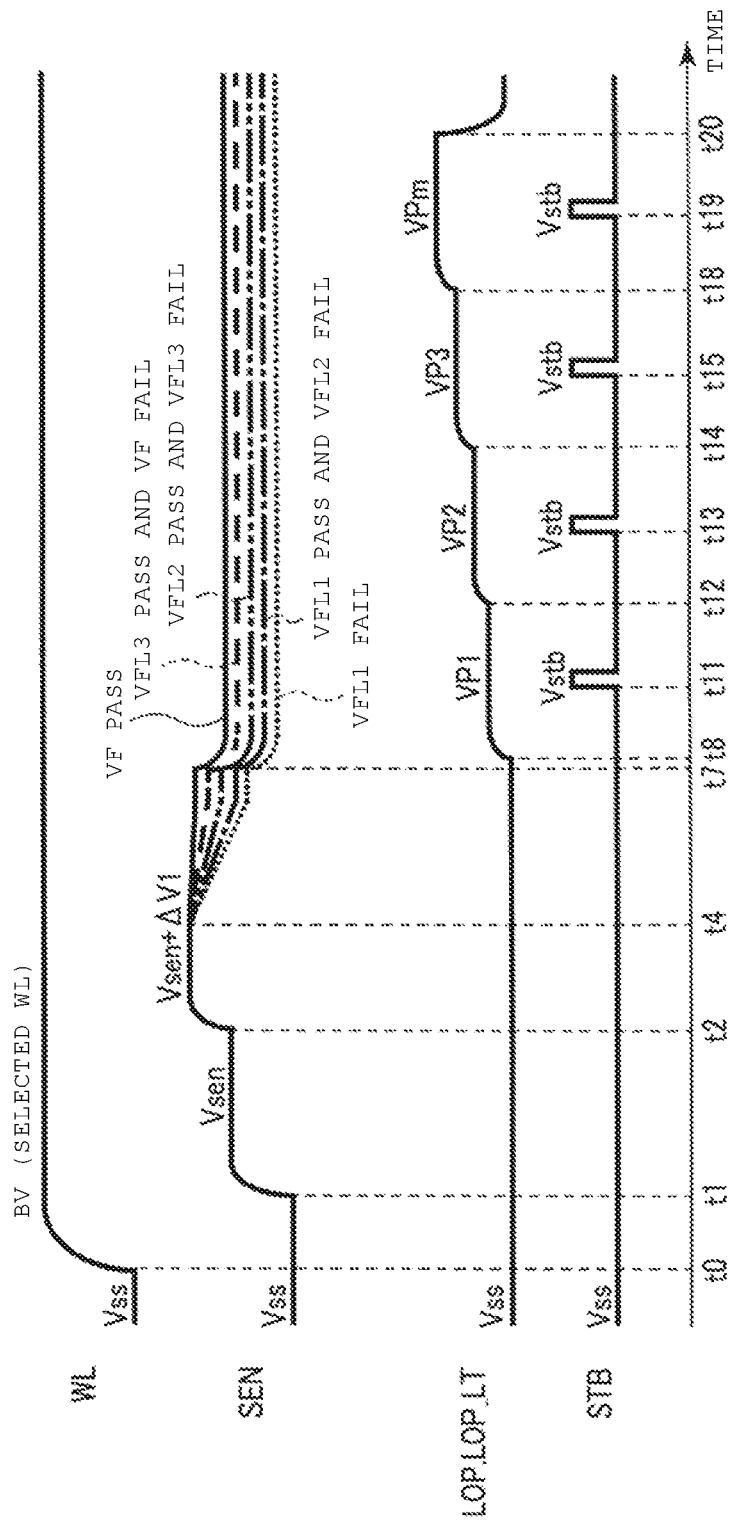
FIG. 18 is a timing diagram of voltages of several wires during verification of a semiconductor memory device according to a modified example of the third embodiment.

FIG. 18 is a timing diagram of voltages of several wires during verification in the $x^{th}$ program loop of the semiconductor memory device 1 according to a modified example of the third embodiment in the same manner as FIG. 7 of the first embodiment. FIG. 18 and the following description also relate to verification for the selected cell transistor MT to which data is written in the B level. In addition, also in FIG. 18, the voltages of the source line CELSRC, the signals BLX, BLC, and BLS, the bit line BL, the non-selected word lines WL, the signals HLL and CLKSA, the bus DBUS, and the signal XXL have the same waveforms as in FIG. 7.

In the modified example, the voltage VP1 is determined such that the transistor Tsen connected to the node SEN connected to the selected cell transistor MT having the threshold voltage lower than the verification voltage AVL is turned on in a case where the node LOP is not biased to the verification voltage VP1 and is turned off in a case where the node LOP is biased to the voltage VP1. The verification voltage AVL is lower than the verification voltage AV.

In addition, in the modified example, the voltage VP2 is determined such that the transistor Tsen connected to the node SEN connected to the selected cell transistor MT having the threshold voltage higher than or equal to the verification voltage AVL and lower than the verification voltage AV is turned on in a case where the node LOP is not biased to the voltage VP2 and is turned off in a case where the node LOP is biased to the voltage VP2.

In addition, a voltage VP3 is selected as follows. The voltage VP3 is determined such that the transistor Tsen connected to the node SEN connected to the selected cell transistor MT having the threshold voltage higher than or equal to the verification voltage AV and lower than the verification voltage BVL is turned on in a case where the voltage of the node LOP is lower than the voltage VP3 and is turned off in a case where the node LOP is biased to the voltage VP3.

Furthermore, in the modified example, the voltage VPm is determined such that the transistor Tsen connected to the node SEN connected to the selected cell transistor MT having the threshold voltage higher than or equal to the verification voltage BVL and lower than the verification voltage BV is turned on in a case where the voltage of the node LOP is lower than the voltage VPm and is turned off in a case where the node LOP is biased to the voltage VPm.

By using the voltages VP1, VP2, VP3, and VPm described above, the selected cell transistors MT having the threshold voltages included in total five ranges of a range lower than the verification voltage AVL, a range higher than or equal to the verification voltage AVL and lower than the verification voltage AV, a range higher than or equal to the verification voltage AV and lower than the verification voltage BVL, a range higher than or equal to the verification voltage BVL and lower than the verification voltage BV, and a range higher than or equal to the verification voltage BV can be indexed. Indexing is performed for the selected cell transistor MT which uses at least the A level or the B level as a target level.

The selected cell transistor MT having the threshold voltage lower than the verification voltage AVL is determined to fail the verification VFL1. The selected cell transistor MT having the threshold voltage higher than or equal to the verification voltage AVL and lower than the verification voltage AV is determined to pass the verification VFL1 and to fail the verification VFL2. The selected cell transistor MT having the threshold voltage higher than or equal to the verification voltage AV and lower than the verification voltage BVL is determined to pass the verification VFL2 and to fail the verification VFL3. The selected cell transistor MT having the threshold voltage higher than or equal to the verification voltage BVL and lower than the verification voltage BV is determined to pass the verification VFL3 and to fail the verification VF. The selected cell transistor MT having the threshold voltage higher than or equal to the verification voltage BV is determined to pass the verification VF.

Figure 19:
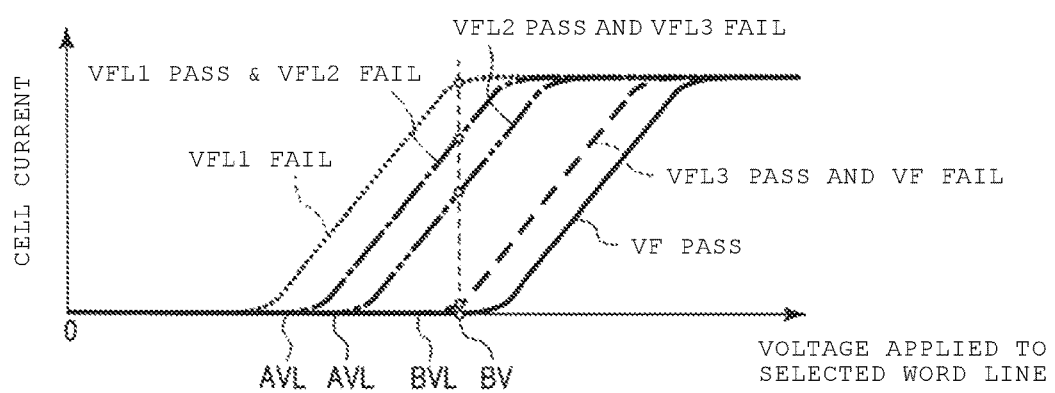
FIG. 19 illustrates a relationship between a cell current and a voltage which is applied to a selected word line of the semiconductor memory device according to the modified example of the third embodiment.

As illustrated in FIG. 19, a corresponding cell current flows through the selected cell transistor MT which passes the verification VFL1 and fails the verification VFL2, in a case where the voltage of the selected word line WL is higher than or equal to the verification voltage AVL. A corresponding cell current flows through the selected cell transistor MT which passes the verification VFL2 and fails the verification VFL3, in a case where the voltage of the selected word line WL is higher than or equal to the verification voltage AV. A corresponding cell current flows through the selected cell transistor MT which passes the verification VFL3 and fails the verification VF, in a case where the voltage of the selected word line WL is higher than or equal to the verification voltage BVL. The selected cell transistor MT which passes the verification VF is determined to pass the verification VF. A corresponding cell current flows in a case where the voltage of the selected word line WL is higher than or equal to the verification voltage BV.

In the $(x+1)^{th}$ program loop, the sequencer 14 executes the programs PG1 and PG2, or the program PGI for the selected cell transistor, based on combination of the indexed ranges and the target level. Details are as follows.

The sequencer 14 executes the program PG1 for the selected cell transistor MT having the threshold voltage lower than the verification voltage AVL.

The sequencer 14 executes the program PG2 for the selected cell transistor MT which uses the A level as the target level among the selected cell transistors MT having the threshold voltages higher than or equal to the verification voltage AVL and lower than the verification voltage AV, and executes the program PG1 for the selected cell transistor MT which uses the B level as the target level.

The sequencer 14 executes the program PGI for the selected cell transistor MT which uses the A level as the target level among the selected cell transistors MT having the threshold voltages higher than or equal to the verification voltage AV and lower than the verification voltage BVL, and executes the program PG1 for the selected cell transistor MT which uses the B level as the target level.

The sequencer 14 executes the program PGI for the selected cell transistor MT which uses the A level as the target level among the selected cell transistors MT having the threshold voltages higher than or equal to the verification voltage BVL and lower than the verification voltage BV, and executes the program PG2 for the selected cell transistor MT which uses the B level as the target level.

The sequencer 14 executes the program PGI for the selected cell transistor MT having the threshold voltages higher than or equal to the verification voltage BV.

According to the modified example, verification of γ level and ϵ level lower than the γ level by one can be completed, while verification voltage γV of one γ level is applied to the word line WL, and the selected cell transistor MT having a level slightly lower than a target level can also be detected. Hence, it is possible to perform efficient verification.

Fourth Embodiment

A fourth embodiment is different from the first embodiment in detailed points of the sense amplifier circuit SAC and the data latch circuit SDL. Hereinafter, point different from the first embodiment will be mainly described.

Figure 20:
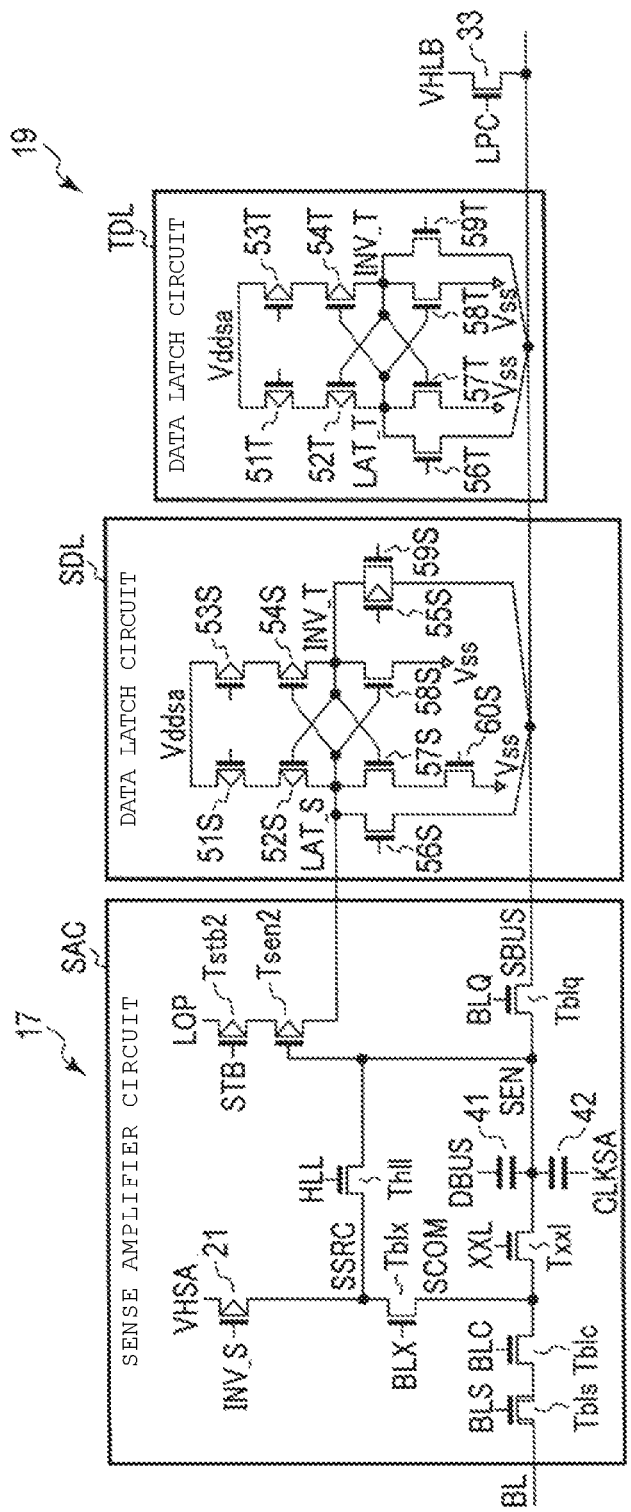
FIG. 20 illustrates a part of elements and connections of a sense amplifier and a data latch according to a fourth embodiment.

FIG. 20 illustrates a part of the sense amplifier 17 and the data latch 19 according to the fourth embodiment. The sense amplifier circuit SAC includes all the elements and connections illustrated in FIG. 20. In a case of each of β=S and T, the data latch circuit βDL has all the elements and connections illustrated in FIG. 20.

As illustrated in FIG. 20, each sense amplifier circuit SAC includes p-type MOSFETs 21, Tstb2, and Tsen2, n-type MOSFETs Tbls, Tblc, Tblx, Thll, Txxl, and Tblq, and capacitors 41 and 42.

Connections of one bit line BL, the transistors 21, Tbls, Tblc, Tblx, Thll, Txxl, and Tblq, and the capacitor 42 are the same as in the first embodiment (FIG. 5). The node SEN is connected to a gate of a transistor Tsen2. A drain of the transistor Tsen2 is connected to the node LAT_S. The transistor Tsen2 is connected in series to the transistor Tstb. A source of a transistor Tstb2 is the node LOP. A gate of the transistor Tstb2 accepts the signal STB.

Each data latch circuit SDL includes transistors 51S, 52S, 53S, 54S, 56S, 57S, 58S, and 59S. Each data latch circuit SDL further includes a p-type MOSFET 55S and an n-type MOSFET 60S. The transistor 55S is connected in parallel to the transistor 59S. A source of the transistor 58S is grounded. A source of the transistor 57S is grounded through the transistor 60S. Sources of each of the transistors 56S and 59S are connected to the bus SBUS.

Sources of each of the transistors 57T and 58T in each data latch circuit TDL are grounded. Sources of each of the transistors 56T and 59T are connected to the bus SBUS.

Figure 21:
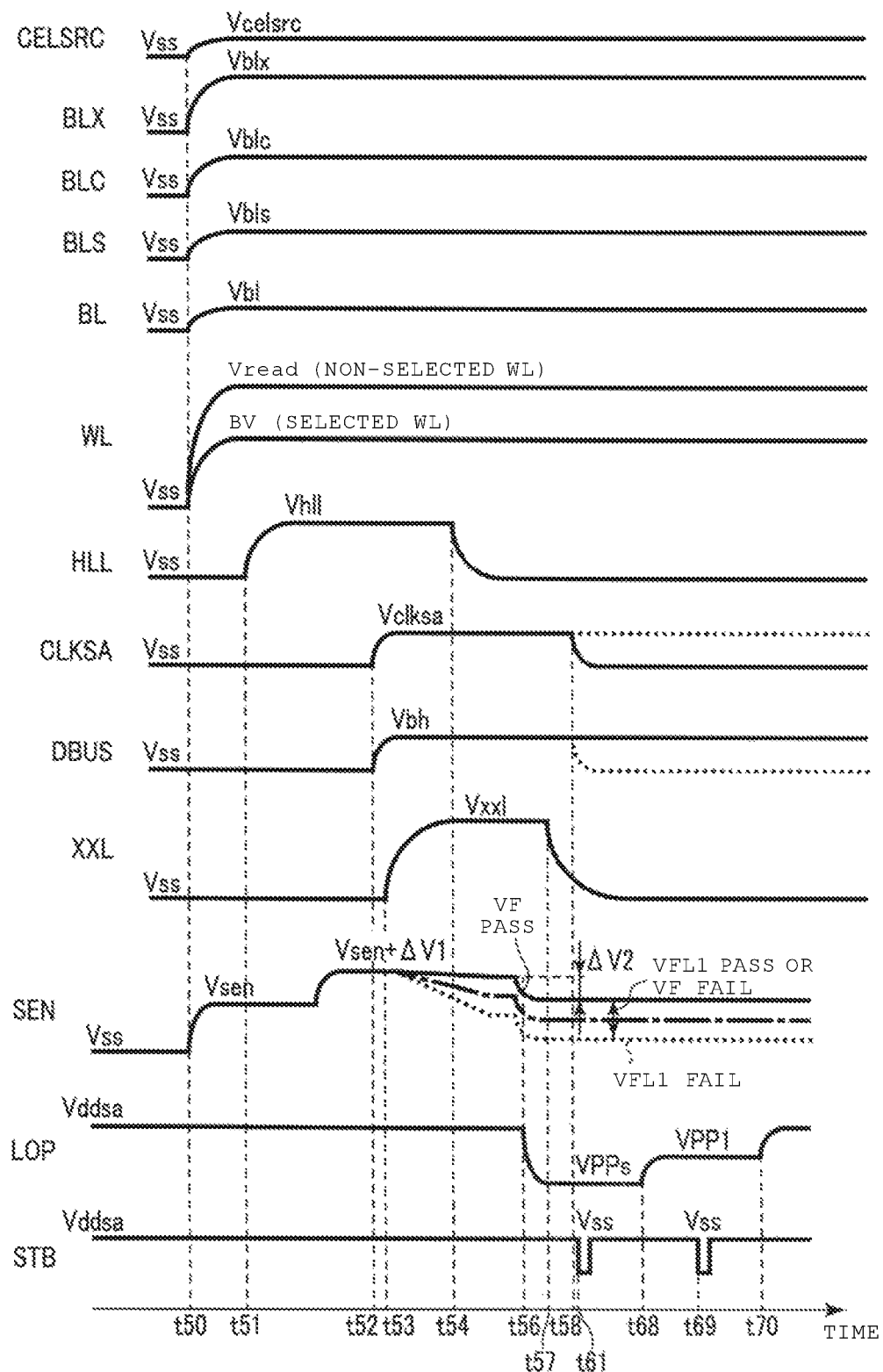
FIG. 21 is a timing diagram of voltages of several wires during verification of the semiconductor memory device according to the fourth embodiment.

FIG. 21 is a timing diagram of voltages which are applied to several wires during verification in the $x^{th}$ program loop in the semiconductor memory device 1 according to the fourth embodiment in the same manner as FIG. 7 of the first embodiment. Times t50, t51, t52, t53, t54, t56, t57, t58, t61, t68, t69, and t70, respectively correspond to the times t0, t1, t2, t3, t4, t6, t7, t8, t11, t18, t19, and t20. As an example, FIG. 21 and the following description relate to verification for the selected cell transistor MT which uses the B level as a target level.

At the time t50, the voltage of the node LOP and the voltage of the signal STB are set to the voltage Vddsa.

Operations from the time t51 to the time t57 are respectively the same as the operations from the time t1 to the time t7.

The sequencer 14 biases the voltage of the node LOP to a voltage VPPs from the time t58. The voltage VPPs is lower than the voltage Vddsa. More specifically, the voltage VPPs has a magnitude for allowing a transistor Tsen2 connected to the node SEN connected to the cell transistor MT having the threshold voltage of a magnitude lower than the verification voltage BV to be turned on, and for allowing the transistor Tsen2 connected to the node SEN connected to the cell transistor MT having the threshold voltage of a magnitude higher than or equal to the verification voltage BV to be turned off. By using the voltage VPPs, the transistor Tsen2 electrically connected to the selected cell transistor MT having the threshold voltage lower than the verification voltage BV is turned on. Meanwhile, the transistor Tsen2 electrically connected to the selected cell transistor MT having the threshold voltage higher than or equal to the verification voltage BV is turned off. Hence, it is possible to determine whether or not the selected cell transistor MT connected to the transistor Tsen2 has the threshold voltage higher than or equal to the verification voltage BV, based on turn-on or turn-off of the transistor Tsen2.

The sequencer 14 performs strobe by setting the signal STB to the voltage Vss from the time t61 over a short period of time while the node LOP has the voltage VPPs. By performing the strobe, a voltage based on a state of the transistor Tsen2 is retained in the node LAT_S by the data latch circuit SDL. Subsequently, data retained in the data latch circuit SDL is transferred to the data latch circuit TDL through the bus SBUS.

The sequencer 14 biases the voltage of the node LOP to a voltage VPP1 from the time t68. The voltage VPP1 is higher than the voltage Vpps and is lower than the voltage Vddsa. More specifically, the voltage VPP1 has a magnitude for allowing the transistor Tsen2 connected to the node SEN connected to the cell transistor MT having the threshold voltage of a magnitude lower than the verification voltage BVL1 to be turned on, and for allowing the transistor Tsen2 connected to the node SEN connected to the cell transistor MT having the threshold voltage of a magnitude higher than or equal to the verification voltage BVL1 to be turned off. By using the voltage VPP1, the transistor Tsen2 electrically connected to the selected cell transistor MT having the threshold voltage lower than the verification voltage BVL1 is turned on. Meanwhile, the transistor Tsen2 electrically connected to the selected cell transistor MT having the threshold voltage higher than or equal to the verification voltage BVL1 is turned off. Hence, it is possible to determine whether or not the selected cell transistor MT connected to the transistor Tsen2 has the threshold voltage higher than or equal to the verification voltage BVL1, based on turn-on or turn-off of the transistor Tsen2.

The sequencer 14 performs strobe by setting the signal STB to the voltage Vss from the time t69 over a short period of time while the node LOP has the voltage VPP1. By performing the strobe, the voltage based on the state of the transistor Tsen2 is retained in the node LAT_S by the data latch circuit SDL.

According to the fourth embodiment, the sense amplifier circuit SAC illustrated in FIG. 20 also obtains the same advantage as the first embodiment.

In addition, the following matters can be applied to each embodiment.

A voltage which is applied to a word line selected in a read operation (read) of an A level in a multilevel read operation is, for example, between 0 V and 0.55 V. The voltage is not limited to this, and may be between 0.1 V and 0.21 V, 0.21 V and 0.31 V, 0.31 V and 0.4 V, 0.4 V and 0.5 V, or 0.5 V and 0.55 V.

A voltage which is applied to a word line selected in a read operation of a B level is, for example, between 1.5 V and 2.3 V. The voltage is not limited to this, and may be between 1.75 V and 1.8 V, 1.8 V and 1.95 V, 1.95 V and 2.1 V, or 2.1 V and 2.3 V.

A voltage which is applied to a word line selected in a read operation of a C level is, for example, between 3.0 V and 4.0 V. The voltage is not limited to this, and may be between 3.0 V and 3.2 V, 3.2 V and 3.4 V, 3.4 V and 3.5 V, 3.5 V and 3.7 V, or 3.7 V and 4.0 V.

A read operation time tR may be, for example, between 25 µs and 38 µs, 38 µs and 70 µs, or 70 µs and 80 µs.

A write operation includes a program operation and a verification operation. During the write operation, a voltage which is initially applied to a word line selected in the program operation is, for example, between 13.7 V and 14.3 V. The voltage is not limited to this, and may be, for example, between 13.7 V and 14.0 V or between 14.0 V and 14.7 V.

The voltage which is initially applied to the selected word line at the time of writing data to odd-numbered word lines, and the voltage which is initially applied to the selected word line at the time of writing data to even-numbered word lines may be changed.

When an incremental step pulse program (ISPP) method is used for the program operation, a step-up voltage may be, for example, approximately 0.5 V.

A voltage which is applied to an non-selected word line may be, for example, between 7.0 V and 7.3 V. The voltage is not limited to this, and, for example, may be between 7.3 V and 8.4 V or may be lower than or equal to 7.0 V.

A bus voltage may change depending on whether the non-selected word line is an odd-numbered word line or an even-numbered word line.

Time tProg of the write operation may be, for example, between 1700 µs and 1800 µs, 1800 µs and 1900 µs, or 1900 µs and 2000 µs.

A voltage that is initially applied to a well which is formed on an upper portion of a semiconductor substrate and on which a memory cell is disposed in an erase operation is, for example, between 12 V and 13.7 V. The voltage is not limited to this, and may be, for example, between 13.7 V and 14.8 V, 14.8 V and 19.0 V, 19.0 V and 19.8 V, or 19.8 V and 21 V.

Time tErase of the erase operation may be, for example, between 3000 µs and 4000 µs, 4000 µs and 5000 µs, or 5000 µs and 9000 µs.

The memory cell includes a charge storage layer which is disposed on the semiconductor substrate (silicon substrate) through a tunnel insulating film with a thickness of 4 to 10 mm. The charge storage layer may have a stacked structure of an insulting film, such as SiN or SiON with a thickness of 2 to 3 nm and polysilicon with a thickness of 3 to 8 nm. In addition, the polysilicon may include a metal such as Ru. An insulating film is formed on the charge storage layer. The insulating film includes, for example, a silicon oxide film with a thickness of 4 to 10 nm interposed between a lower layer High-k film with a thickness of 3 to 10 nm and an upper layer High-k film with a thickness of 3 to 10 nm. HfO or the like may be used as the High-k film. In addition, a thickness of the silicon oxide film may be greater than the thickness of the High-k film. A control electrode with a thickness of 30 to 70 nm is formed on the insulating layer through a material with a thickness of 3 to 10 nm. Here, such a material is a metal oxide film such as TaO, or a metal nitride film such as TaN. W or the like may be used as the control electrode.

In addition, an air gap can be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:
1. A semiconductor memory device comprising:
a memory cell transistor;
a bit line that is electrically connected to a terminal of the memory cell transistor;
a sense amplifier circuit that includes a first transistor having a gate which is connected to the bit line through a plurality of transistors, which when turned on, electrically connects the gate of the first transistor to the bit line, and a second transistor having a first terminal which is connected in series to a first terminal of the first transistor;
a voltage generation circuit having an output electrically connected to a second terminal of the first transistor;
and a control unit configured to control the voltage generation circuit to apply a first voltage to the second terminal of the first transistor during a first period in a program verification operation and a second voltage to the second terminal of the first transistor during a second period in the program verification operation following the first period, wherein the first voltage is equal to or higher than 0 V and the second voltage is higher than 0 V and the first voltage and the second voltage have voltage levels different from each other.

2. The semiconductor memory device according to claim 1, wherein the second period directly follows the first period, and the first voltage is higher than 0 V and lower than the second voltage.

3. The semiconductor memory device according to claim 1, wherein the control unit is configured to execute a program operation on the memory cell transistor followed by a verification operation on the memory cell transistor, and the first and second periods occur during the verification operation.

4. The semiconductor memory device according to claim 3, wherein the control unit, during the program operation on the memory cell transistor, sets the bit line to one of at least three voltage levels depending on whether a verification operation on the memory cell transistor following a prior program operation on the memory cell transistor failed completely, failed partially, or passed.

5. The semiconductor memory device according to claim 1, further comprising:
a latch circuit configured to latch a voltage level at a sense node that is electrically connected to the gate of the first transistor, wherein
the control unit, during each of the first and second periods, turns the second transistor on and off, to transfer the voltage level at the sense node to the latch circuit.

6. The semiconductor memory device according to claim 5, wherein
the latch circuit has first and second sets of transistors electrically connected in series between a high voltage node and a low voltage node, and
the control unit controls the voltage generation circuit during the first and second periods to apply the same voltage applied to the second terminal of the first transistor, to the low voltage node.

7. The semiconductor memory device according to claim 5, wherein
the latch circuit has first and second sets of transistors electrically connected in series between a high voltage node and a low voltage node which is electrically connected to ground.

8. The semiconductor memory device according to claim 7, wherein
a data bus connecting the sense amplifier circuit to the latch circuit is grounded through a third transistor, and
the control unit, during each of the first and second periods, turns the third transistor on and off after turning the second transistor on and off.

9. A method of performing a write operation in a semiconductor memory device including a memory cell transistor, a bit line that is electrically connected to a terminal of the memory cell transistor, a sense amplifier circuit that includes a first transistor having a gate which is connected to the bit line through a plurality of transistors, which when turned on, electrically connects the gate of the first transistor to the bit line, and a second transistor having a first terminal which is connected in series to a first terminal of the first transistor, and a voltage generation circuit having an output electrically connected to a second terminal of the first transistor, said method comprising:
performing a program operation on the memory cell transistor; and then
performing a verification operation on the memory cell transistor,
wherein during the verification operation, a first voltage is applied to the second terminal of the first transistor during a first period in a program verification operation and a second voltage is applied to the second terminal of the first transistor during a second period in the program verification operation following the first period, and
the first voltage is equal to or higher than 0 V and the second voltage is higher than 0 V, and the first voltage and the second voltage have voltage levels different from each other.

10. The method according to claim 9, wherein the second period directly follows the first period, and the first voltage is higher than 0 V and lower than the second voltage.

11. The method according to claim 9, further comprising:
performing a subsequent program operation on the memory cell transistor, wherein
during the subsequent program operation, the bit line is set to one of at least three voltage levels depending on whether the verification operation on the memory cell transistor failed completely, failed partially, or passed.

12. The method according to claim 9, wherein
the semiconductor memory device further includes a latch circuit configured to latch a voltage level at a sense node that is electrically connected to the gate of the first transistor, and
during each of the first and second periods, the second transistor is turned on and off to transfer the voltage level at the sense node to the latch circuit.

13. The method according to claim 12, wherein
the latch circuit has first and second sets of transistors electrically connected in series between a high voltage node and a low voltage node, and
during the first and second periods, the same voltage applied to the second terminal of the first transistor is applied to the low voltage node.

14. The method according to claim 12, wherein
the latch circuit has first and second sets of transistors electrically connected in series between a high voltage node and a low voltage node which is electrically connected to ground.

15. The method according to claim 14, wherein
the semiconductor memory device further includes a data bus that connects the sense amplifier circuit to the latch circuit and is connected to ground through a third transistor, and
during each of the first and second periods, the third transistor is turned on and off after the second transistor is turned on and off.

16. A semiconductor memory device comprising:
a memory cell transistor;
a bit line that is electrically connected to a terminal of the memory cell transistor;
a sense amplifier circuit that includes a first transistor having a gate which is connected to the bit line through a plurality of transistors, which when turned on, electrically connects the gate of the first transistor to the bit line, and a second transistor having a first terminal which is connected in series to a first terminal of the first transistor;
a voltage generation circuit having an output electrically connected to a second terminal of the second transistor;
and a control unit configured to control the voltage generation circuit to apply a first voltage to the second terminal of the second transistor during a first period in a program verification operation, a second voltage to the second terminal of the second transistor during a second period in the program verification operation following the first period, and a third voltage to the second terminal of the second transistor during a third period in the program verification operation following the second period, wherein the first voltage is higher than either the second voltage or the third voltage, and the second voltage and the third voltage have different voltage levels.

17. The semiconductor memory device according to claim 16, wherein the third period directly follows the second period, and the second voltage is lower than the third voltage.

18. The semiconductor memory device according to claim 16, wherein the control unit is configured to execute a program operation on the memory cell transistor followed by a verification operation on the memory cell transistor, and the first, second, and third periods occur during the verification operation.

19. The semiconductor memory device according to claim 18, wherein the control unit, during the program operation on the memory cell transistor, sets the bit line to one of at least three voltage levels depending on whether a verification operation on the memory cell transistor following a prior program operation on the memory cell transistor failed completely, failed partially, or passed.

20. The semiconductor memory device according to claim 16, further comprising:

a latch circuit configured to latch a voltage level at a sense node that is electrically connected to the gate of the first transistor, wherein the control unit, during each of the second and third periods, turns the second transistor on and off, to transfer the voltage level at the sense node to the latch circuit.

* * * * *